(12) United States Patent
Nakayama et al.

(10) Patent No.: US 6,333,894 B1
(45) Date of Patent: Dec. 25, 2001

(54) SEMICONDUCTOR STORAGE DEVICE

(75) Inventors: Akira Nakayama; Yuichi Matsushita, both of Miyazaki (JP)

(73) Assignee: Oki Electric Industry, Co., Ltd. (JP)

(*) Notice: Subject to any disclaimer, the term of this patent is extended or adjusted under 35 U.S.C. 154(b) by 0 days.

(21) Appl. No.: 09/657,811

(22) Filed: Sep. 8, 2000

(30) Foreign Application Priority Data

Apr. 27, 2000 (JP) .................................................. 12-127083

(51) Int. Cl.[7] .................................................... G11C 8/00

(52) U.S. Cl. .......................... 365/233; 365/220; 365/221

(58) Field of Search ............................. 365/230.03, 233, 365/221, 220

(56) References Cited

U.S. PATENT DOCUMENTS

| | | | |
|---|---|---|---|
| 4,882,710 | * 11/1989 | Hashimoto et al. | 365/189.05 |
| 5,206,834 | * 4/1993 | Okitaka et al. | 365/259 |
| 5,365,485 | * 11/1994 | Ward et al. | 365/221 |
| 5,398,209 | * 3/1995 | Iwakari et al. | 365/230.03 |

* cited by examiner

Primary Examiner—Son T. Dinh
(74) Attorney, Agent, or Firm—Venable; James R. Burdett

(57) ABSTRACT

The present invention implements a decrease in chip size. The device is comprised of memory cell arrays 34a and 34b, a bank selector 36, a cell select circuit 38a, a data multiplexer 40, and an input/output buffer 42. The bank selector generates a bank select signal and selects the memory cell arrays alternately. The cell select circuit selects a predetermined memory cell of the memory cell array selected by the bank select signal and performs a read operation from and a write operation to this memory cell. The data multiplexer transfers the read data from the memory cell array selected by the bank select signal to the input/output buffer.

12 Claims, 25 Drawing Sheets

SEMICONDUCTOR STORAGE DEVICE

BACKGROUND OF THE INVENTION

1. Field of the Invention

The present invention relates to a line memory which has a relatively small capacity and can execute a completely synchronized write operation and read operation.

2. Description of Related Art

FIG. 27 shows a circuit configuration of a conventional line memory. This line memory comprises one memory cell array 10. The line memory also comprises four data registers 12, 14, 16 and 18 each of which has a register for one line. These data registers 12–18 are connected to the memory cell array 10 via bit lines BL. This line memory also has a data sub-register 20 which has a register for one line. This line memory further comprises an X decoder 22, an X predecoder 24, an address counter 26, a read/write controller 28, an input buffer 30 and an output buffer 32. The X decoder 22 is connected to the memory cell array 10 via the word line WL. The read/write controller 28 generates a read control signal RC and a write control signal WC to control the data registers 12–18. These components are synchronized with common clock signals.

The write operation is executed as follows. At first, write data WD is input from the input port Din to the input buffer 30. The write data WD, driven by the input buffer 30, is sequentially written to the data sub-register 20. After one line of data is written to the data sub-register 20, the next write data is written to the first data register 12. After one line of data is written to the first data register 12, the address counter 26 generates an X address signal XA. This X address signal is sent to the X decoder 26 via the X predecoder 24 and is decoded by the X decoder 26. By the decoded X address signal, the word line WL is activated. Then by the activation of the write control signal WC, all the data of the first data register 12 is transferred in batch to the memory cell array 10 via the bit line BL. During this time, the next write data is sequentially written to the second data register 14. After writing the data to the second data register 14, the written data is transferred in batch to the memory cell array 10, just like the data of the first data register 12, and writing to the first data register 12 is executed during this time. By repeating these operations, a continuous write operation is implemented.

Read operation is executed as follows. At first, the data of the data sub-register 20 is sequentially output to the output buffer 32. The read data RD of the output buffer 32 is output to the output port Dout. During this time, the X address signal generated by the address counter 26 is decoded by the X decoder 22 and the word line is activated by the decoded X address signal. Then the read control signal RC is generated, and one line of data of the memory cell array 10 is transferred in batch to the third data register 16 via the bit line. After reading the data sub-register 20 completes, and the third data register 16 is read. During this time, a data transfer to the fourth data register 18 is executed, just like the data of the third data register 16. By repeating these operations, a continuous read operation is implemented.

Therefore according to the line memory shown in FIG. 27, a line memory operation where a read operation and a write operation are completely a synchronized is possible. With this line memory, line memory operation in accordance with a specification where functions are partially restricted as shown in the timing chart in FIG. 28 is also possible. In FIG. 28, CLK shows a clock signal and RST shows a reset signal. A read operation and a write operation of data are executed synchronizing with the cycle unit of the clock signal CLK. As FIG. 28 shows, this line memory reads the data R0 from the address No.0 of the memory cell array 10 at the first clock cycle CLK0. At the next clock cycle CLK1, data W0 is written to the address No.0, and data R1 is also read from the address No.1. At the next clock cycle CLK2, data W1 is written to the address No.1, and the data R2 is also read from the address No.2. At the next clock cycle CLK3, data W2 is written to the address No.2, and data R3 is also read from the address No.3. In this way, at one cycle after the read operation from a memory cell at a predetermined address of the memory cell array 10, a write operation is executed to the memory cell at this address, and a read operation is executed to a memory cell at another address.

However, if the circuit configuration shown in FIG. 27 is used to configure a small capacity line memory with a specification where functions are restricted as shown in FIG. 28, the layout area of the data register, data sub-register and read/write controller becomes larger than the layout area of the memory cell array, which makes it difficult to decrease the chip size.

SUMMARY OF THE INVENTION

It is an object of the present invention to provide a semiconductor storage device which can decrease chip size.

According to this invention, the semiconductor storage device performs a read operation and a write operation of data synchronizing with the cycle unit of a clock signal. This semiconductor storage device comprises two memory cell arrays. At one cycle after a read operation from a memory cell at a predetermined address of one of the memory cell arrays, a write operation is performed to the memory cell at the same address of this memory cell array, and a read operation is also performed to a memory cell at a predetermined address of the other memory cell array.

In accordance with this configuration, a semiconductor storage device which can perform a line memory operation can be configured without using a data register and data sub-register. Therefore the chip size can be decreased.

According to a preferred embodiment of the semiconductor storage device of the present invention, the semiconductor storage device further comprises an array select circuit, a cell select circuit, a data transfer circuit and an input/output buffer. In this case, the array select circuit generates an array select signal for selecting the memory cell arrays alternately. The cell select circuit selects a predetermined memory cell of the memory cell array selected by the array select signal and performs a read operation and a write operation to this memory cell. The data transfer circuit transfers the read data from the memory cell array selected by the array select signal to the input/output buffer.

According to another preferred embodiment of the semiconductor storage device of the present invention, the semiconductor storage device further comprises an input/output data amplifier for amplifying the write data which is sent from the input/output buffer to the memory cell array and the read data which is sent from the memory cell array to the data transfer circuit.

According to still another preferred embodiment of the semiconductor storage device of the present invention, the cell select circuit further comprises an address generation circuit, a row decoder and a column decoder. In this case, the address generation circuit generates a row address signal and a column address signal for the memory cell array selected by the array select signal. The row decoder selects a predetermined word line according to the row address signal, and the column decoder selects a predetermined bit line according to the column address signal. By this configuration, a predetermined memory cell of a predetermined memory cell array is selected.

According to still another preferred embodiment of the semiconductor storage device of the present invention, the cell select circuit further comprises an address counter as the address generation circuit, a row decoder and a column decoder for each one of the memory cell arrays. In this case, the row decoder is comprised of a row predecoder and a row main decoder, and the column decoder is comprised of a column predecoder and a column main decoder. When the row predecoder generates a row predecoding signal according to the row address signal from the address counter, the row main decoder selects a predetermined word line according to this row predecoding signal. When the column predecoder generates a column predecoding signal according to the column address signal from the address counter, the column main decoder selects a predetermined bit line according to this column predecoding signal.

According to still another preferred embodiment of the semiconductor storage device of the present invention, the cell select circuit further comprises one address counter as the address generation circuit, and also comprises a row decoder and a column decoder for each one of the memory cell arrays. In this case, the row decoder is comprised of a row predecoder and a row main decoder, and the column decoder is comprised of a column predecoder and a column main decoder. When the row predecoder generates a row predecoding signal according to the row address signal from the address counter, the row main decoder selects a predetermined word line according to this row predecoding signal. When the column predecoder generates a column predecoding signal according to the column address signal from the address counter, the column main decoder selects a predetermined bit line according to this column predecoding signal. The row predecoder and the column predecoder have a latching function for holding the row predecoding signal and the column predecoding signal for a predetermined period respectively.

In accordance with this configuration, the predecoder has a predecoding signal latching function, so the same address can be continuously specified for a predetermined period even if the counting-up of the address counter is done.

For example, in the first cycle, the counting of the address counter is up after a read operation from the first address of the first memory cell array is executed, and in the following second cycle, a read operation from the second address of the second memory cell array is executed. In this second cycle, the predecoder for the first memory cell array latches the predecoding signal based on the address signal in the first cycle. Therefore in the second cycle, a write operation to the memory cell at the first address of the first memory cell array can be executed.

In this way, an address of each memory cell array can be specified and a predetermined read/write operation can be executed with one address counter. According to this configuration, the layout area can be decreased for the space of one address counter.

According to still another preferred embodiment of the semiconductor storage device of the present invention, the row decoder is comprised of a row predecoder and a row main decoder, the column decoder is comprised of a column predecoder and a column main decoder, the cell select circuit is comprised of one address counter as the address generation circuit, one row predecoder and one column predecoder, and is also comprised of a row main decoder and a column decoder for each memory cell array. In this case, when the row predecoder generates a row predecoding signal according to the row address signal from the address counter, the row main decoder has a latching function to select a predetermined word line according to this row predecoding signal, and holds the selection of this word line for a predetermined period. When the column predecoder generates a column predecoding signal according to the column address signal from the address counter, the column main decoder has a latching function to select a predetermined bit line according to this column predecoding signal, and holds the selection of this bit line for a predetermined period.

According to this configuration, the main decoder has a decoding signal latching function, so the address can be continuously specified for a predetermined period even if the counting of the address counter is up. Therefore an address of each memory cell array can be specified and a predetermined read/write operation can be executed with one address counter. So according to this configuration, the layout area can be decreased for the spaces of one address counter, one row predecoder and one column predecoder.

According to still another preferred embodiment of the semiconductor storage device of the present invention, the cell select circuit further comprises a row pointer for sequentially selecting a predetermined word line according to the array select signal, and a column pointer for sequentially selecting a predetermined bit line according to the array select signal.

In accordance with this configuration, control of an address specification is easier and the number of peripheral circuits is less, so the layout area can be decreased.

According to still another embodiment of the semiconductor storage device of the present invention, the semiconductor storage device further comprises an array select circuit, a cell select circuit, a data transfer circuit, an input/output buffer, and an input/output data amplifier. In this case, the array select circuit generates an array select signal for selecting the memory cell arrays alternately. The cell select circuit selects a predetermined memory cell of the memory cell array selected by the array select signal, and performs a read operation and a write operation to this memory cell. The data transfer circuit performs processing for transferring the read data from the memory cell array selected by the array select signal to the input/output data amplifier, and processing for transferring the write data sent from the input/output data amplifier to a predetermined memory cell array. And the input/output data amplifier amplifies the write data which is sent from the input/output buffer to the data transfer circuit, and the read data which is sent from the data transfer circuit to the input/output buffer.

In accordance with this configuration, two memory cell arrays share the input/output data amplifier, so the layout area can be decreased.

According to still another preferred embodiment of the semiconductor storage device of the present invention, the semiconductor storage device further comprises a data register for the first bit, wherein the data transfer circuit further comprises a circuit for transferring data read from the data register to the input/output buffer, the array select circuit further comprises a circuit for selecting the data register in addition to selecting the memory cell array, and the data register is accessed only for the first bit at a read operation and a write operation.

In accordance with this configuration, the layout area can be decreased and reset is possible even during access of either one of the memory cell arrays.

According to still another preferred embodiment of the semiconductor storage device of the present invention, the array select signal is comprised of a first and second array select signals which rise alternately, and the array select circuit is comprised of a clock port where a clock signal is input, a reset port where a reset signal is input, and a first and second output ports where the first and second array select signals are output respectively. This array select circuit is further comprised: a first inverter where the clock port is connected at the input side and which outputs the reverse phase signal of the clock signal to a first node at the output side; a first transfer gate, which is connected between a second node and a third node, has gate terminals where the clock signal and the reverse phase signal thereof are input, and turns ON when this reverse signal is activated or is supplied thereto; a second transfer gate, which is connected between a fourth node and a fifth node, has gate terminals where the clock signal and the reverse phase signal thereof are input, and turns ON when this clock signal is activated or is supplied thereto; a NOR circuit where the reset port and the third node are connected at the input side respectively and the fourth node is connected at the output side; a second inverter where the first output port is connected at the input side and the second node is connected at the output side; a third inverter for latching the fourth node; a fourth inverter where the fourth node is connected at the input side, and the first output port is connected at the output side; a fifth inverter for latching the first output port; and a sixth inverter where the first output port is connected at the input side and the second output port is connected at the output side.

According to still another preferred embodiment of the semiconductor storage device of the present invention, the array select signal is comprised of a first and second array select signals which rise alternately, and the data transfer circuit is comprised of a first and second input ports where the first and second array select signals are input respectively, a first and second read ports where read signals from each one of the memory cell arrays are input respectively, and a third read port which alternately outputs the read signals input to the first and second read ports. This data transfer circuit is further comprised: a first inverter where the first input port is connected at the input side and which outputs the reverse phase signal of the first block select signal to the first node at the output side; a first transfer gate, which is connected between the first read port and the third node, has gate terminals where the first block select signal and the reverse phase signal thereof are input, and turns ON when the first block select signal is activated or is supplied thereto; a second inverter where the second input port is connected at the input side and which outputs the reverse phase signal of the second block select signal to the second node at the output side; a second transfer gate, which is connected between the second read port and the third node, has gate terminals where the second block select signal and the reverse phase signal thereof are input, and turns ON when this second block select signal is activated or is supplied thereto; a third inverter where the third node is connected at the input side and the fourth node is connected at the output side; a fourth inverter where the fourth node is connected at the input side and the third read port is connected at the output side; and a fifth inverter for latching the fourth node.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Embodiments of the present invention will now be described with reference to the accompanying drawings. The drawings schematically illustrate configurations only to help understand the present invention. The following numerics and other conditions are merely examples. Therefore the present invention is not in any way restricted by the embodiments.

[First Embodiment]

Figure 1:
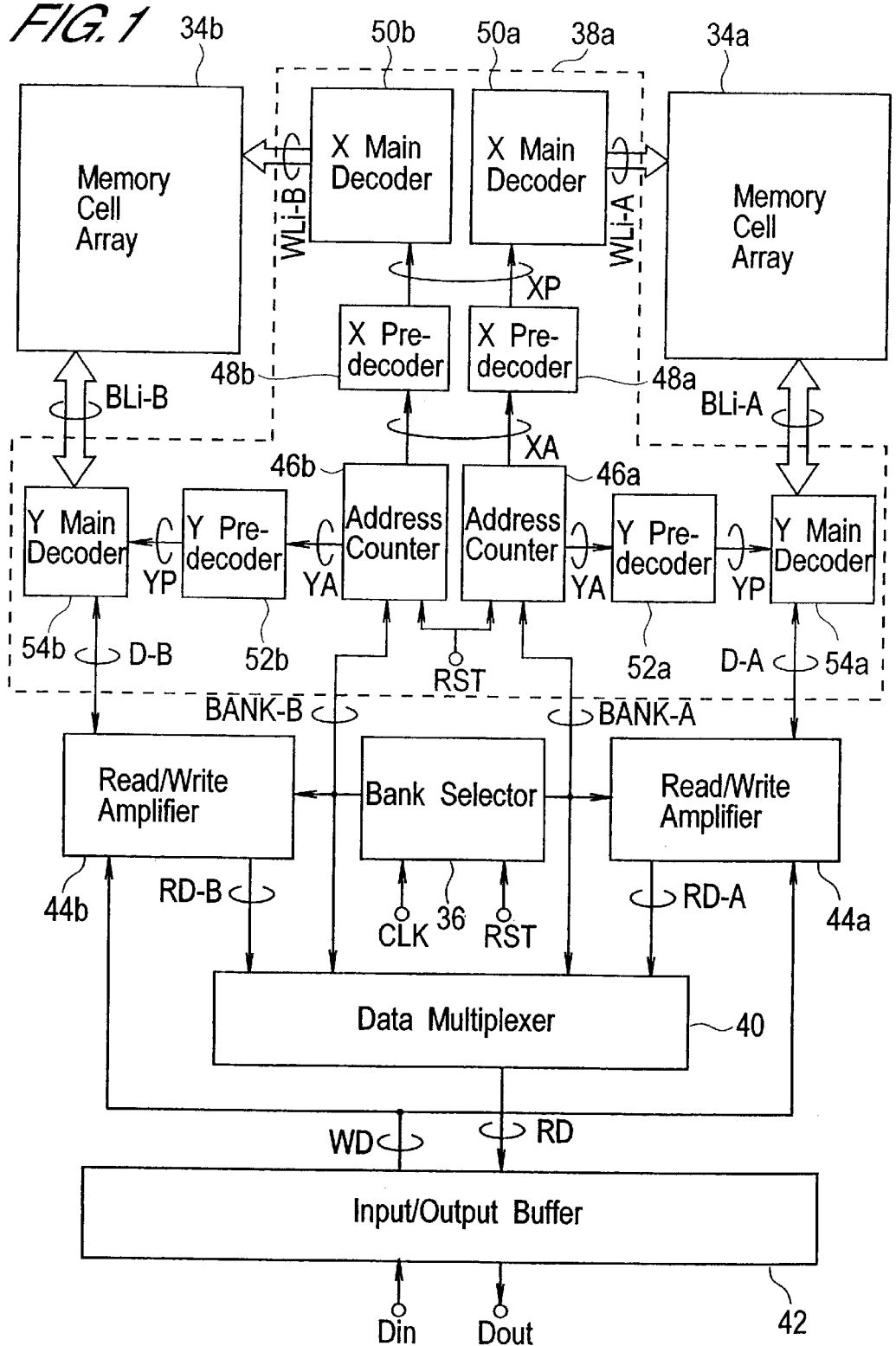
FIG. 1 is a diagram depicting a configuration of a semiconductor storage device of the first embodiment of the present invention.

FIG. 1 is a block diagram schematically depicting a configuration of a semiconductor storage device of the first embodiment. This semiconductor storage device comprises two memory cell arrays (hereafter also called banks) 34a and 34b. This semiconductor storage device further comprises a bank selector 36 as an array select circuit, a cell select circuit 38a, a data multiplexer 40 as a data transfer circuit and an input/output buffer 42. To simplify description, it is assumed here that memory cells in the memory cell array 34a and 34b are SRAM cells.

The above mentioned bank selector 36 generates a bank select signal (array select signal) to select the memory cell arrays 34a and 34b alternately. This bank select signal is comprised of BANK-A (first array select signal) and BANK-B (second array select signal) which rise alternately.

The above mentioned cell select circuit 38a selects a predetermined memory cell of the memory cell array selected by the bank select signal, and executes a read operation and a write operation to this memory cell.

The above mentioned data multiplexer 40 transfers the read data RD from the memory cell array selected by the bank select signal to the input/output buffer 42.

This semiconductor storage device further comprises read/write amplifiers 44a and 44b as an input/output data amplifier for each bank. These read/write amplifiers 44a and 44b amplify the write data WD, which is sent from the input/output buffer 42 to the memory cell array, and the read data RD, which is sent from the memory cell array to the data multiplexer 40.

In this embodiment, the above mentioned cell select circuit 38a is comprised of an address generation circuit, an X decoder (row decoder) and a Y decoder (column decoder).

In the address generation circuit, each bank has an address counter 46a and 46b. These address counters generate an X address signal (row address signal) and a Y address signal (column address signal) for the memory cell array selected by the bank select signal.

In this semiconductor storage device, the X decoder selects a predetermined word line according to the X address signal (also called X address), and the Y decoder selects a predetermined bit line according to the Y address signal (also called Y address), so as to select a predetermined memory cell of the predetermined memory cell array. The X decoder and the Y decoder are provided for each bank. In this example, the X decoder is comprised of an X predecoder (row predecoder) and an X main decoder (row main decoder). The Y decoder is comprised of a Y predecoder (column predecoder) and a Y main decoder (column main decoder).

Specifically, the X decoder for the memory cell array 34a is comprised of an X predecoder 48a and an X main decoder 50a. The Y decoder for the memory cell array 34a is comprised of a Y predecoder 52a and a Y main decoder 54a. The X decoder for the memory cell array 34b is comprised of an X predecoder 48b and an X main decoder 50b. And the Y decoder for the memory cell array 34b is comprised of a Y predecoder 52b and a Y main decoder 54b.

The above mentioned predecoder generates a predecoding signal (also called predecode) according to the address signal from the address counter.

In other words, the X predecoder 48a generates the X predecoding signal XP according to the X address signal XA from the address counter 46a. The Y predecoder 52a generates the Y predecoding signal YP according to the Y address signal YA from the address counter 46a. The X predecoder 48b generates the X predecoding signal XP according to the X address signal XA from the address counter 46b. And the Y predecoder 52b generates the Y predecoding signal YP according to the Y address signal YA from the address counter 46b.

Figure 2:
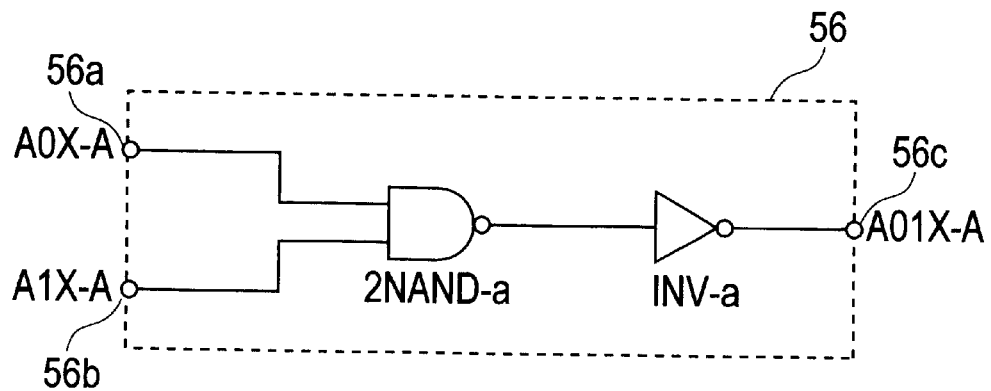
FIG. 2 is a diagram depicting a configuration of a predecoder of the first embodiment.

FIG. 2 is a circuit diagram depicting a configuration example of the X predecoder 48a. The X predecoder 48a in FIG. 2 has a first basic circuit 56 which is comprised of a two-input NAND-a and an inverter INV-a. The X address signals A0X-A and A1X-A generated by the address counter 46a are input to each input terminal 56a and 56b of the two-input NAND-a. The output signal from this two-input NAND-a is output to the output terminal 56c as the X predecoding signal A01X-A via the inverter INV-a.

The actual X predecoder 48a is comprised of a required number of the first basic circuits 56 according to the memory capacity. For example, another basic circuit 56 outputs the X predecoding signal A23X-A based on the X address signals A2X-A and A3X-A generated by the address counter 46a.

The configuration of the other predecoders, that is, the X predecoder 48b, the Y predecoder 52a and the Y predecoder 52b, is the same as the configuration of the above mentioned X predecoder 48a. And the X predecoder 48b, for example, outputs the X predecoding signal A01X-B based on the X address signals A0X-B and A1X-B generated by the address counter 46b.

The above mentioned main decoder selects (decodes) a predetermined word line according to the predecoding signal from the predecoder.

Figure 3:
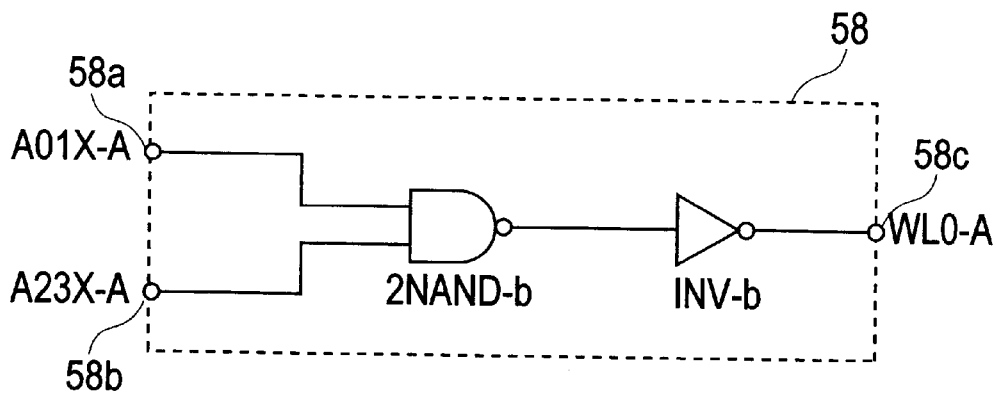
FIG. 3 is a diagram depicting a configuration of a main decoder of the first embodiment.

FIG. 3 is a circuit diagram depicting a configuration example of the X main decoder 50a. The X main decoder 50a in FIG. 3 has a second basic circuit 58 which is comprised of a two-input NAND-b and an inverter INV-b. The actual X main decoder 50a is comprised of a required number of the second basic circuits 58 according to the memory capacity. To each input terminal 58a and 58b of the two-input NAND-b, the X address signals A01X-A and A23X-A generated by the X predecoder 48a are input. The output signal from the two-input NAND-b is output to the output terminal 58c connected to a predetermined word line WL0-A via the inverter INV-b.

The configuration of the other main decoders, that is, the X main decoder 50b, the Y main decoder 54a and the Y main decoder 54b, is the same as the configuration of the above mentioned X main decoder 50a.

In this way, the above mentioned X main decoder 50a selects a predetermined word line WLi-A according to the X predecoding signal XP from the X predecoder 48a. The Y main decoder 54a selects a predetermined bit line BLi-A according to the Y predecoding signal YP from the Y predecoder 52a.

When the word line WLi-A is selected by the X decoder, the stored data of the memory cell connected to the word line is output to the bit line BLi-A. When one of the bit lines BLi-A is selected by the Y decoder, the stored data is sent to the read/write amplifier 44a by the data line D-A as the read data. The read data RD-A amplified by the read/write amplifier 44a is sent to the data multiplexer 40. In this way, data is read from the memory cell of the memory cell array 34a.

The write data WD is amplified by the read/write amplifier 44a, then is sent to the Y main decoder 54a by the data line D-A. And the word line WLi-A is selected by the X decoder, and the Y main decoder 54a selects one bit line BLi-A. In this way, data is written to the memory cell of the memory cell array 34a.

The X main decoder 50b, on the other hand, selects a predetermined word line WLi-B according to the X predecoding signal XP from the X predecoder 48b. The Y main decoder 54b selects a predetermined bit line BLi-B according to the Y predecoding signal YP from the Y predecoder 52b.

When the word line WLi-B is selected by the X main decoder, the stored data of the memory cell connected to the word line is output to the bit line BLi-B. When one of the bit lines BLi-B is selected by the Y decoder, the stored data is sent to the read/write amplifier 44b by the data line D-B as the read data. The read data RD-B amplified by the read/write amplifier 44b is sent to the data multiplexer 40. In this way, data is read from the memory cell of the memory cell array 34b.

The write data WD is amplified by the read/write amplifier 44b, then is sent to the Y main decoder 54b by the data line D-B. And the word line WLi-B is selected by the X decoder, and the Y main decoder 54b selects one bit line BLi-B. In this way, data is written to the memory cell of the memory cell array 34b.

Figure 4:
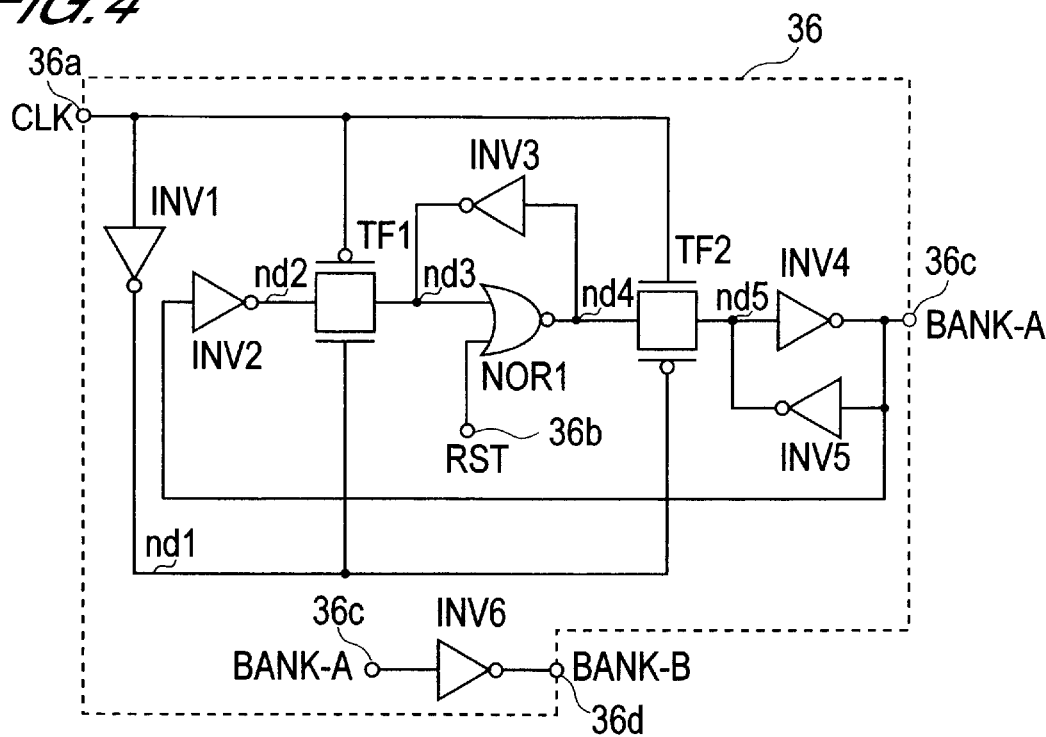
FIG. 4 is a diagram depicting a configuration of a bank selector of the first embodiment.

The configuration of the bank selector 36 will now be described with reference to the circuit diagram in FIG. 4.

The bank selector 36 is comprised of a clock port 36a where the clock signal CLK is input, a reset port 36b where a reset signal RST is input, and a first and second output ports 36c and 36d where the bank select signals BANK-A and BANK-B are output respectively.

This bank selector 36 is comprised of six inverters, two transfer gates TF1 and TF2, and one NOR circuit NOR1.

The first inverter INV1, where the clock port 36a is connected to the input terminal, outputs a reverse phase signal of the clock signal CLK from the output terminal to the first node nd1, which is a connection point with TF1 and TF2.

The first transfer gate TF1, which is connected between the second inverter INV2 and the NOR circuit NOR1, has gate terminals where the clock signal CLK and the reverse phase signal thereof are input respectively, and turns ON when this reverse phase signal is activated (or is supplied to the gate TF1). The connection point of the input terminal of TF1 and the output terminal of the second inverter INV2 is the second node nd2, and the connection point of the output terminal of TF1 and the second input terminal of NOR1 is the third node nd3.

The second transfer gate TF2, which is connected between the fourth inverter INV4 and the NOR circuit NOR1, has gate terminals where the clock signal CLK and the reverse phase signal thereof are input respectively, and turns ON when this clock signal is activated (or is supplied to the gate TF2). The connection point of the input terminal TF2 and the output terminal of NOR1 is the fourth node nd4.

In the NOR circuit NOR1, the first input terminal is connected to the reset port 36b and the third node nd3 is connected to the second input terminal, and the fourth node nd4 is connected to the output terminal.

In the second inverter INV2, the first output port 36c is connected to the input terminal and the second node nd2 is connected to the output terminal.

In the third inverter INV3, the fourth node nd4 is connected to the input terminal and the third node nd3 is connected to the output terminal, so as to latch the signals generated at the fourth node nd4.

In the fourth inverter INV4, the input terminal is connected to the output terminal of TF2, and the connection point is the fifth node nd5. The output terminal of INV4 is connected to the first output port 36c.

In the fifth inverter INV5, the input terminal is connected to the first output port 36c, and the output terminal is connected to the fifth node nd5, so as to latch the signals generated at the first output port 36c.

In the sixth inverter INV6, the first output port 36c is connected to the input terminal, and the second output port 36d is connected to the output terminal.

The bank selector 36 starts the bank select signals BANK-A and BANK-B alternately at the rise of the clock signal CLK. Immediately after the rise of the reset signal RST, however, the bank select signal BANK-A always rises.

Figure 5:
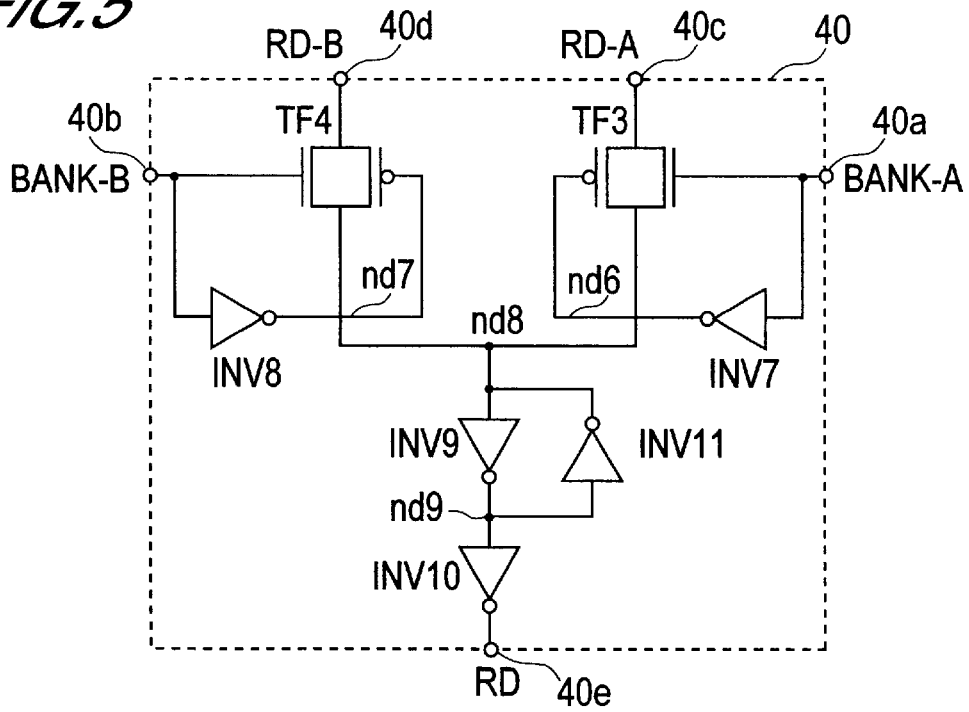
FIG. 5 is a diagram depicting a configuration of a data multiplexer of the first embodiment.

The configuration of the data multiplexer 40 will now be described with reference to the circuit diagram in FIG. 5.

The data multiplexer 40 is comprised of a first and second input ports 40a and 40b where the bank select signals BANK-A and BANK-B are input respectively, a first and second read ports 40c and 40d where the read data signals RD-A and RD-B from each memory cell array are input respectively, and a third read port 40e where the read data signals input to the first and second read ports are alternately output as the read data RD.

This data multiplexer 40 is comprised of five inverters INV7–INV11 and two transfer gates TF3 and TF4.

In the seventh inverter INV7, the first input port 40a is connected to the input terminal and the reverse phase signal of the first bank select signal BANK-A is output from the output terminal to TF3. The connection point of the output terminal of INV7 and one gate terminal of TF3 is the sixth node nd6.

The third transfer gate TF3 comprises an input terminal connected to a first read port 40c, and an output terminal connected to the eighth node nd8 which is a connection point of the output terminal of TF4, input terminal of INV9, and output terminal of INV11. The TF3 also comprises gate terminals where the first bank select signal BANK-A and the reverse phase signal thereof are input respectively, and turns ON when the first bank select signal BANK-A is activated (or is supplied to the TF3).

In the eighth inverter INV8, the second input port 40b is connected to the input terminal, and the reverse phase signal of the second bank select signal BANK-B is output from the output terminal to one gate terminal of TF4. The connection point of this one gate terminal of TF4 and the output terminal of INV8 is the seventh node nd7.

The fourth transfer gate TF4 has an input terminal connected to the second read port 40d and an output terminal connected to the eighth node nd8. TF4 also has gate terminals where the second bank select signal BANK-B and the reverse phase signal thereof are input respectively, and turns ON when this second bank select signal BANK-B is activated (or is supplied to the TF4).

In the ninth inverter INV9, the eighth node nd8 is connected to the input terminal, and the output terminal is connected to the ninth node nd9 which is a connection point of the input terminal of INV10 and the input terminal of INV11.

In the tenth inverter INV10, the ninth node nd9 is connected to the input terminal and the third read port 40e is connected to the output terminal.

In the eleventh inverter INV11, the ninth node nd9 is connected to the input terminal, and the eighth node nd8 is connected to the output terminal, so as to latch the signals generated at the ninth node nd9.

This data multiplexer 40 alternately outputs RD-A and RD-B at the rise of the bank select signals BANK-A and BANK-B.

The operation of the semiconductor storage device will now be described with reference to the timing charts in FIG. 6 and FIG. 7. The respective components shown in FIG. 1–FIG. 5 are synchronized by an ordinary clock signal. In the following descriptions, the circuits related to the read operation and the write operation of the memory cell array 34a (memory cell array 34a, address counter 46a, X predecoder 48a, X main decoder 50a, Y predecoder 52a, Y main decoder 54a and read/write amplifier 44a) are collectively called "bank A". The circuits related to the read operation and the write operation of the memory cell array 34b (memory cell array 34b, address counter 46b, X predecoder 48b, X main decoder 50b, Y predecoder 52b, Y main decoder 54b and read/write amplifier 44b) are collectively called "bank B".

Figure 6:
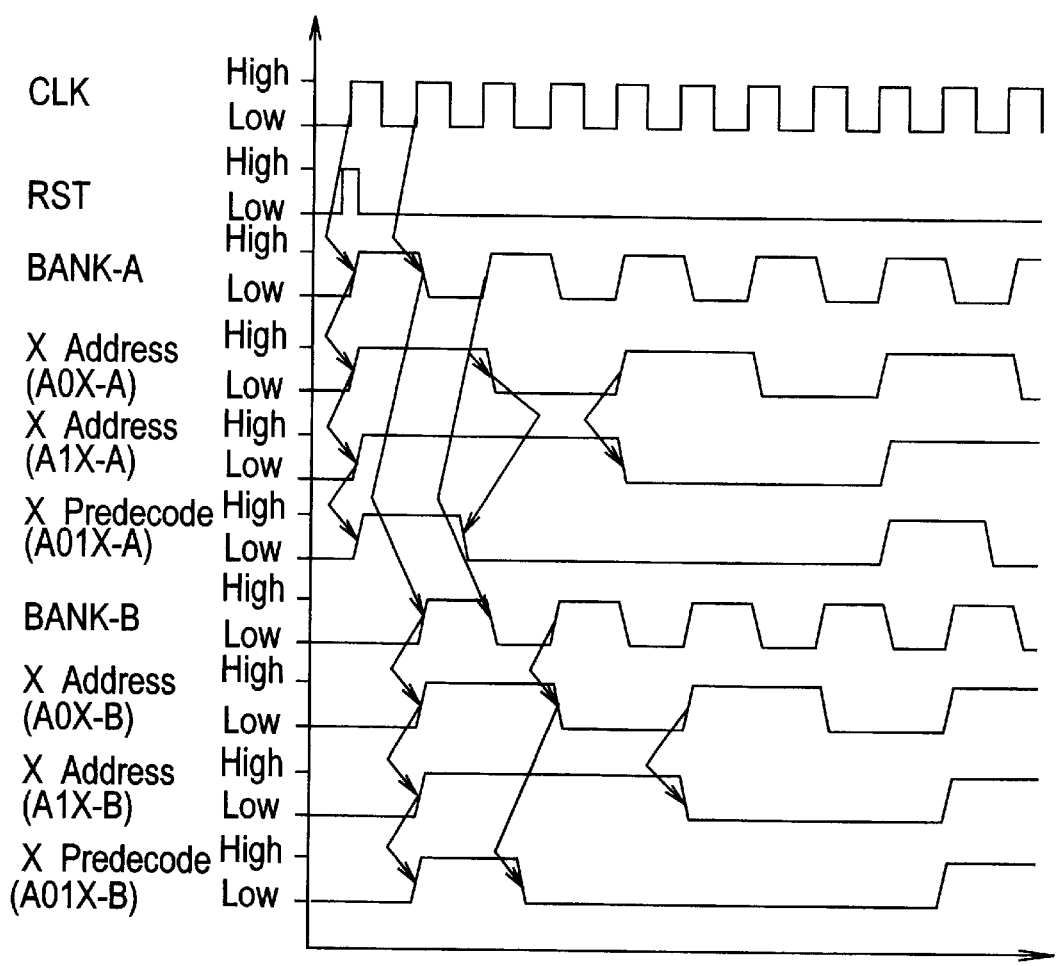
FIG. 6 is an operational diagram of the semiconductor storage device of the first embodiment.

As FIG. 6 shows, the bank select signals BANK-A and BANK-B alternately rise synchronizing with the cycle of the clock signal CLK. The address counters 46a and 46b count up at the rise of the bank select signals BANK-A and BANK-B. The address signal from one address counter 46b is one cycle of the clock signal CLK behind the address signal from the other address counter 46a.

Figure 7:
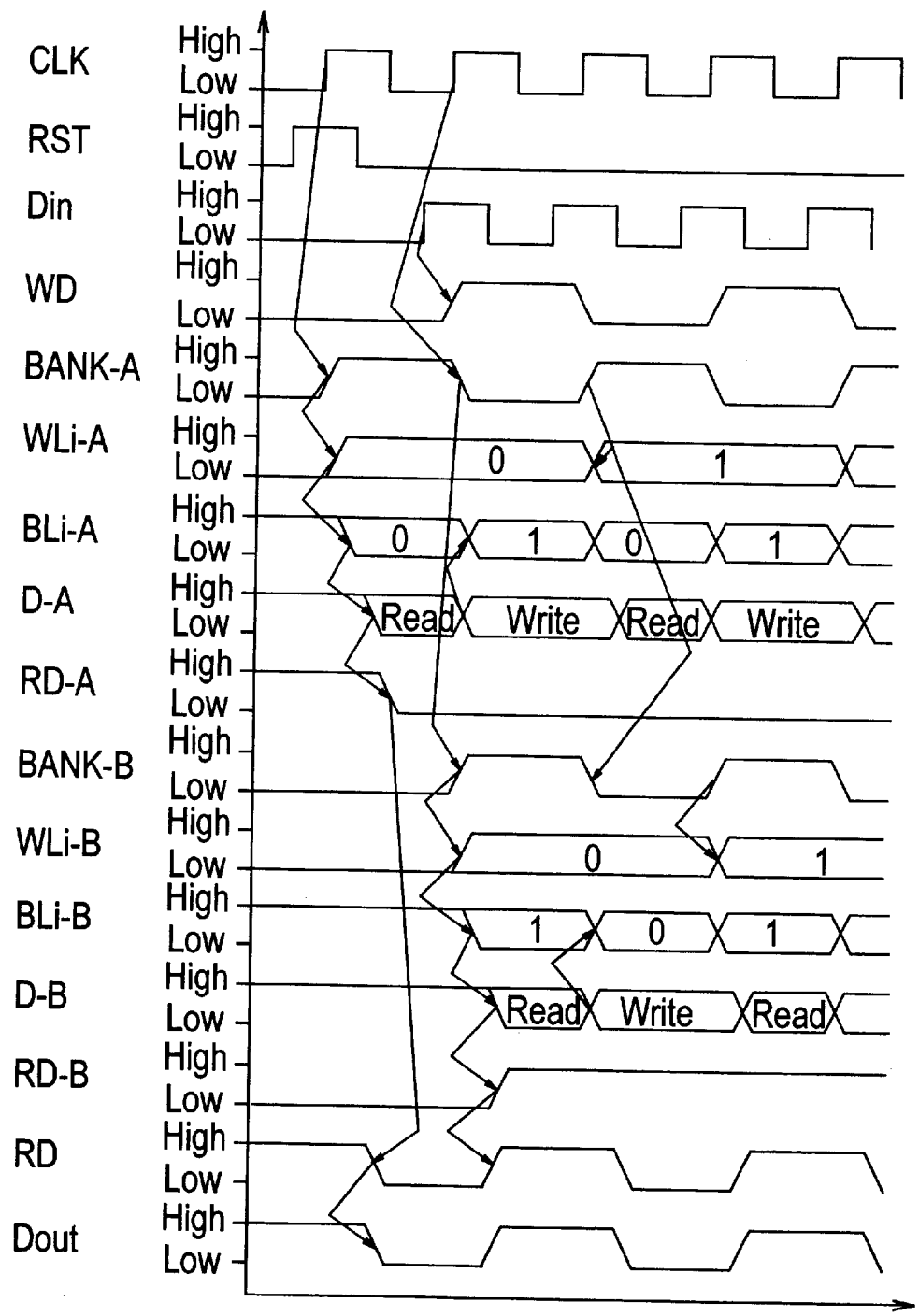
FIG. 7 is an operational diagram of the semiconductor storage device of the first embodiment.

FIG. 7 shows operational waveforms when a low level (corresponds to logic level "0") is stored in a memory cell of the memory cell array 34a, a high level (corresponds to logic level "1") is stored in a memory cell of the memory cell array 34b, a high level is written to the memory cell array 34a, and a low level is written to the memory cell array 34b. For the bit line and data line, both a positive signal and a negative signal (complementary signal) are shown.

In the bank A, the X address to be output from the address counter 46b counts up at the rise of the bank select signal BANK-A. By this X address, the word line WLi-A decoded (selected) by the X predecoder 48a and the X main decoder 50a starts up, and data of the memory cell is output to the bit line BLi-A. Then by the Y address, the bit line BLi-A decoded (selected) by the Y predecoder 52a and the Y main decoder 54a is connected to the data line D-A, and the data of the selected bit line BLi-A is output to the data line D-A. The data which was output to the data line D-A is amplified by the read/write amplifier 44a and is output as the read data RD-A. And while the bank select signal BANK-A is being activated, the read data RD-A is transferred to the input/output buffer 42 by the data multiplexer 40, and is output from the output port Dout. In this way, a read operation is executed.

Then the bank select signal BANK-A falls, but the data line D-A and the bit line BLi-A are still connected by the Y main decoder 54a, and the word line WLi-A is also still selected. Therefore when the write data WD from the input port Din is fetched by the input/output buffer 42 and the Y main decoder 54a is driven by the write amplifier 44a, this write data WD is written to the memory cell via the data line and the bit line. In this way, a write operation is executed.

Figure 8:
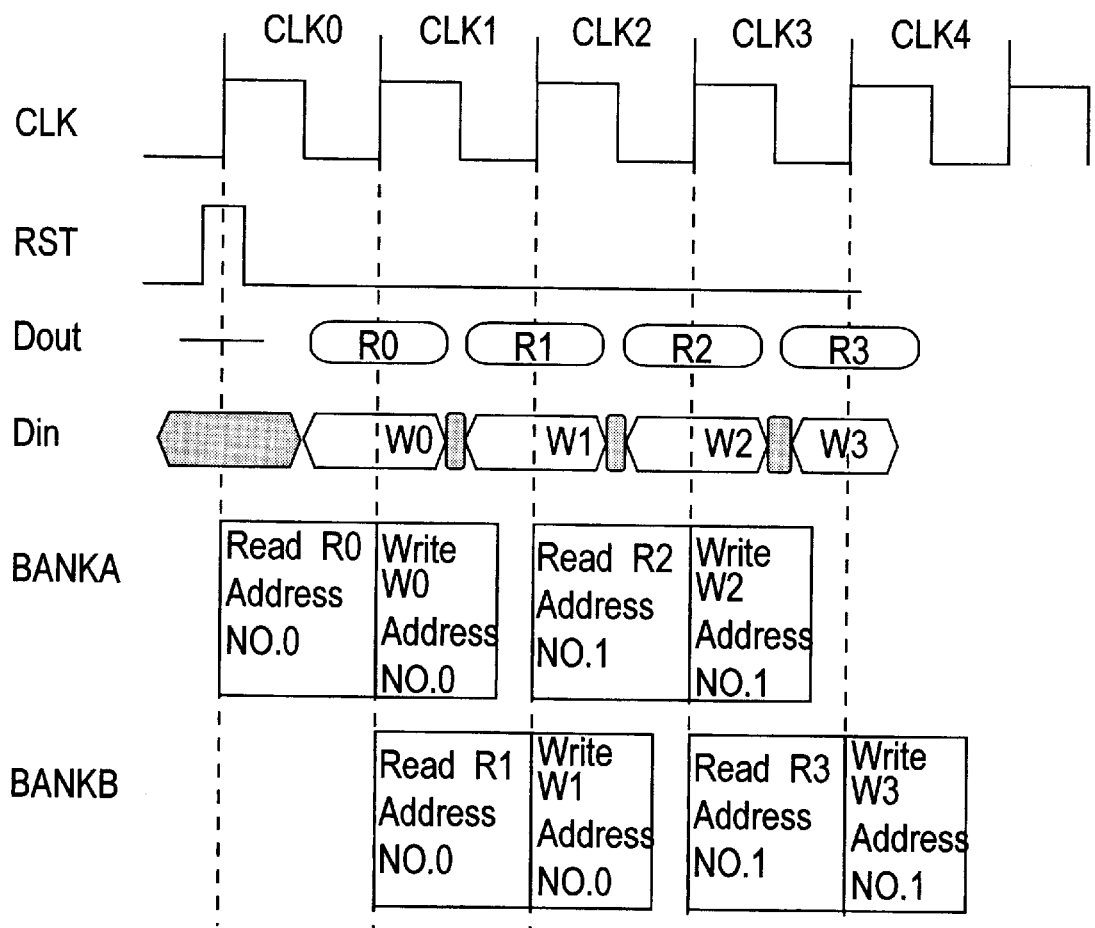
FIG. 8 is an operational diagram of the semiconductor storage device of the first embodiment.

In the bank B, on the other hand, the same operation as the bank A is executed at the rise and fall of the bank select signal BANK-B. As a result, as the timing chart in FIG. 8 shows, a write operation is executed in the bank B while a read operation is executed in the bank A, and a write operation is executed in the bank A while a read operation is executed in the bank B.

In other words, data R0 is read from the address No.0 of the memory cell array 34a of the bank A during the first clock cycle CLK0. During the next clock cycle CLK1, data W0 is written to the address No.0 of the bank A, and data R1 is read from the address No.0 of the memory cell array 34b of the bank B. During the next clock cycle CLK2, data W1 is written to the address No.0 of the bank B and data R2 is read from the address No.1 of the bank A. During the next clock cycle CLK3, data W2 is written to the address No.1 of the bank A and data R3 is read from the address No.1 of the bank B.

In this way, the semiconductor storage device of the present embodiment executes a read operation from a memory cell at a predetermined address of one memory cell array, and during one cycle after this read operation, a write operation is executed to the memory cell at the same address of this memory cell array, and a read operation is also executed to a memory cell at a predetermined address of the other memory cell array. As mentioned above, a continuous read operation and a continuous write operation can be simultaneously executed by repeating this operation.

In this way, a line memory operation without using a data register and a data sub-register becomes possible by a two-bank configuration. As a result, chip size can be decreased.

[Second Embodiment]

Figure 9:
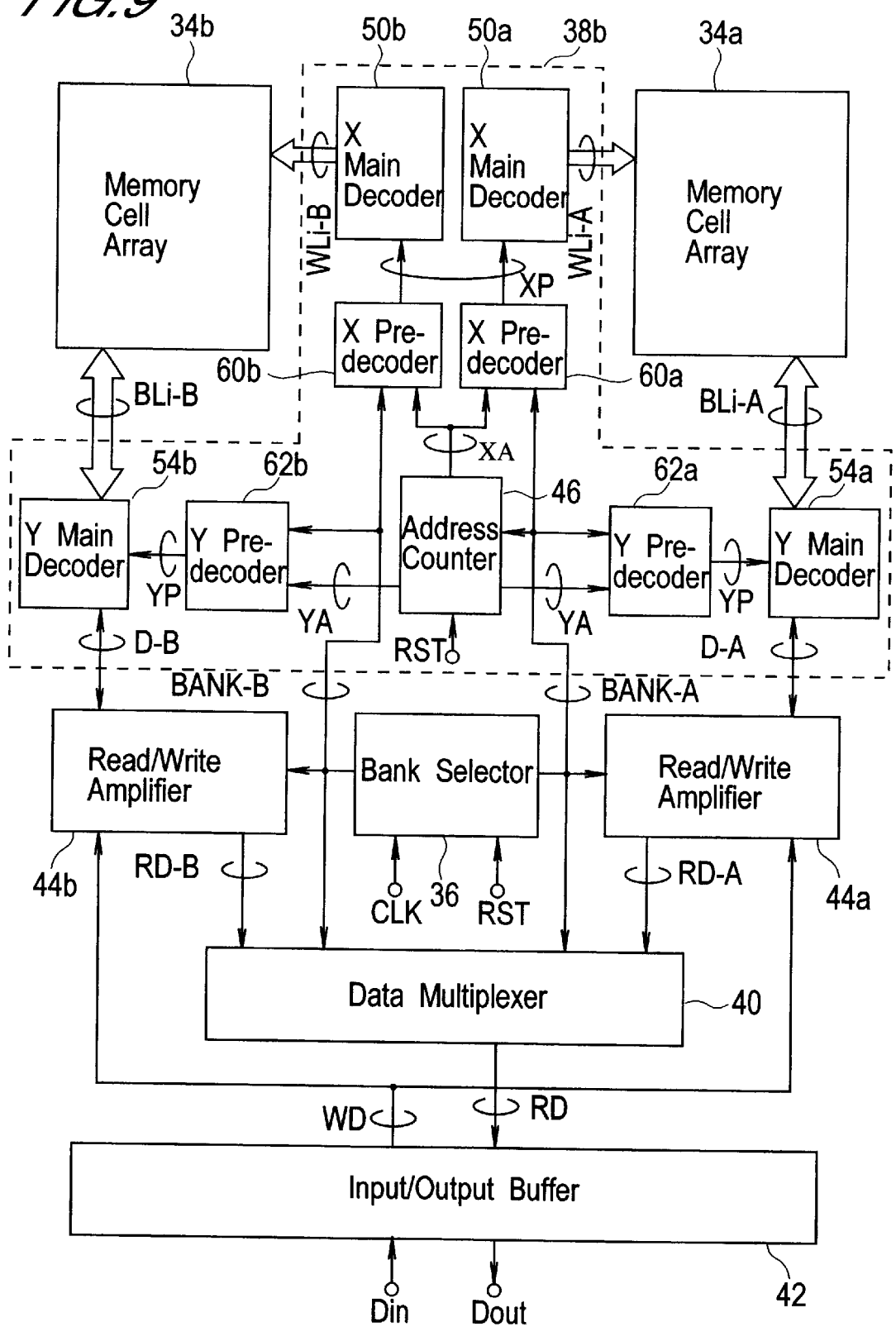
FIG. 9 is a configuration of a semiconductor storage device of the second embodiment of the present invention.

FIG. 9 is a block diagram schematically depicting a configuration of a semiconductor storage device of the second embodiment. This semiconductor storage device has a different cell select circuit 38b, instead of the cell select circuit 38a described for the first embodiment. Since the rest of the configuration is the same as the first embodiment, description thereof will be omitted.

The above mentioned cell select circuit 38b is comprised of one address counter 46 as an address generation circuit, and an X decoder and a Y decoder for each memory cell array 34a and 34b. The X decoder for the memory cell array 34a is comprised of an X predecoder 60a and an X main decoder 50a. The Y decoder for the memory cell array 34a is comprised of a Y predecoder 62a and a Y main decoder 54a. The X decoder for the memory cell array 34b is comprised of an X predecoder 60b and an X main decoder 50b. And the Y decoder for the memory cell array 34b is comprised of a Y predecoder 62b and a Y main decoder 54b.

In this embodiment, the X predecoders 60a and 60b and the Y predecoders 62a and 62b have a latching function to hold the X predecoding signal XP and the Y predecoding signal YP for a predetermined period.

Figure 10:
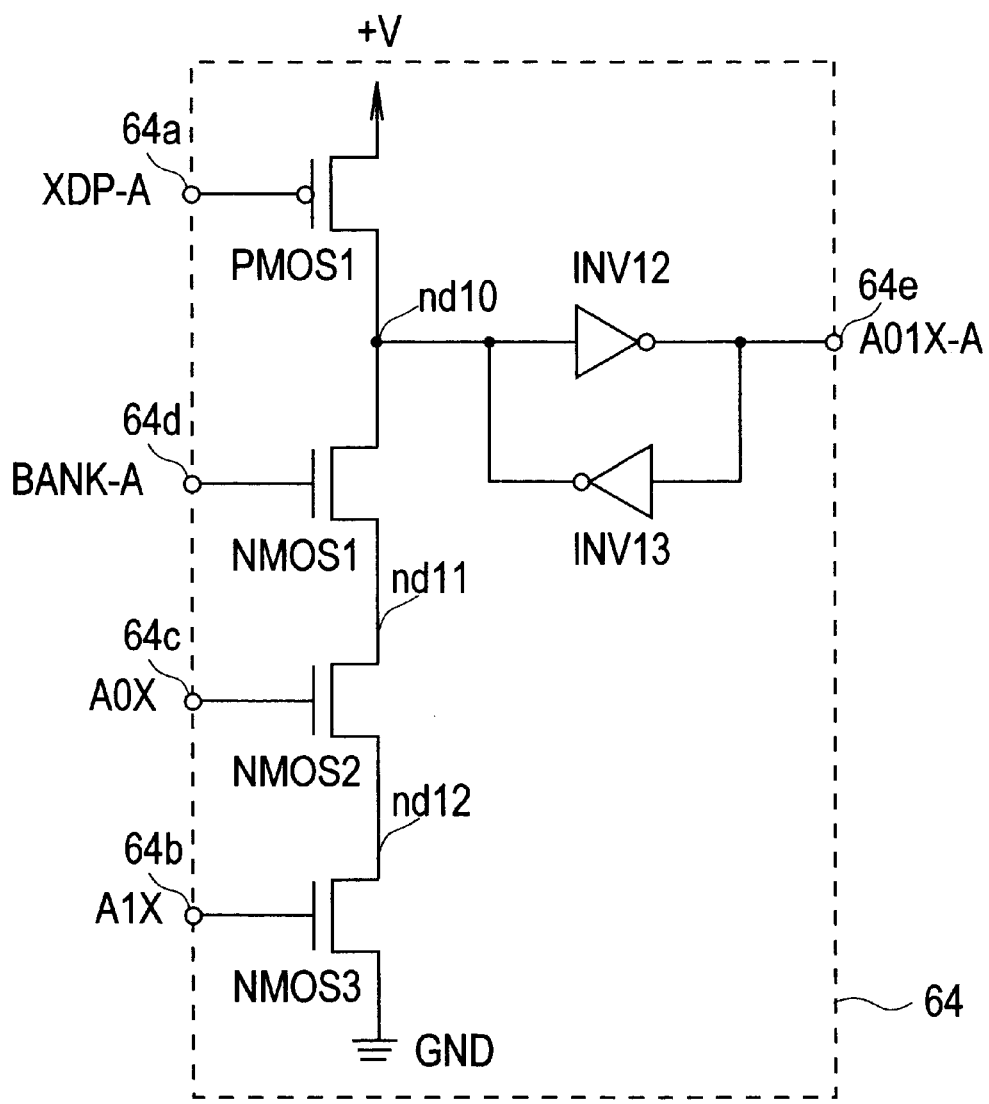
FIG. 10 is a diagram depicting a configuration of a predecoder of the second embodiment.

FIG. 10 is a circuit diagram depicting a configuration example of the X predecoder 60a. The X predecoder 60a in FIG. 10 has a third basic circuit 64 which is comprised of one PMOS transistor, three NMOS transistors and two inverters. The channels of these transistors PMOS1, NMOS1, NMOS2 and NMOS3 are sequentially connected in series between the power supply (+V) and the ground. The connection point of PMOS transistor PMOS1 and NMOS1 is the tenth node nd10. The gate of the transistor PMOS1 is connected to the input terminal 64a where the X decoder precharge XDP-A is input. The connection point of NMOS1 and NMOS2 is the eleventh node nd11, and the connection point of NMOS2 and NMOS3 is the twelfth node nd12. The channel of the NMOS transistor NMOS3 is connected between the ground and the twelfth node nd12, and the gate electrode is connected to the input terminal 64b where the X address A1X is input. The channel of the NMOS transistor NMOS2 is connected between the eleventh node nd11 and the twelfth node nd12, and the gate electrode is connected to the input terminal 64c where the X address A0X is input. The channel of the NMOS transistor NMOS1 is connected between the tenth node nd10 and the eleventh node nd11, and the gate electrode is connected to the input terminal 64d where the bank select signal BANK-A is input. The input terminal of the twelfth inverter INV12 is connected to the tenth node nd10, and the output terminal is connected to the output terminal 64e where the X predecoding signal A01X-A is output. The output terminal of the thirteenth inverter INV13 is connected to the tenth node nd10, and the input terminal is connected to the output terminal 64e, so as to latch the X predecoding signal A01X-A.

This circuit 64 controls the rise of the X predecoding signal A01X-A by the bank select signal BANK-A, and controls the fall of the X predecoding signal A01X-A by the X decoder precharge signal DP-A. And this circuit 64 latches the previous potential when both signals BANK-A and XDP-A are not activated (or are not supplied thereto). The X decoder precharge signal XDP-A, however, rises at almost the same timing as the signal BANK-A and falls just before the rise of the next signal BANK-A.

The actual X predecoder 60a is comprised of a required number of the aforementioned third basic circuits 64 according to the memory capacity. The configuration of the other predecoders, that is, the X predecoder 60b, the Y predecoder 62a, and the Y predecoder 62b, is the same as the configuration of the above mentioned X predecoder 60a. And the X predecoder 60b, for example, outputs the X predecoding signal A01X-B based on the X address signals A0X and A1X generated by the address counter 46. The rise of the X predecoding signal A01X-B is controlled by the bank select signal BANK-B, and the fall of the X predecoding signal A01X-B is controlled by the X decoder precharge signal XDP-B.

The operation of this semiconductor storage device will now be described with reference to the timing chart in FIG. 11. Since operations other than the cell select circuit 38b are the same as the case of the first embodiment, description thereof will be omitted.

Figure 11:
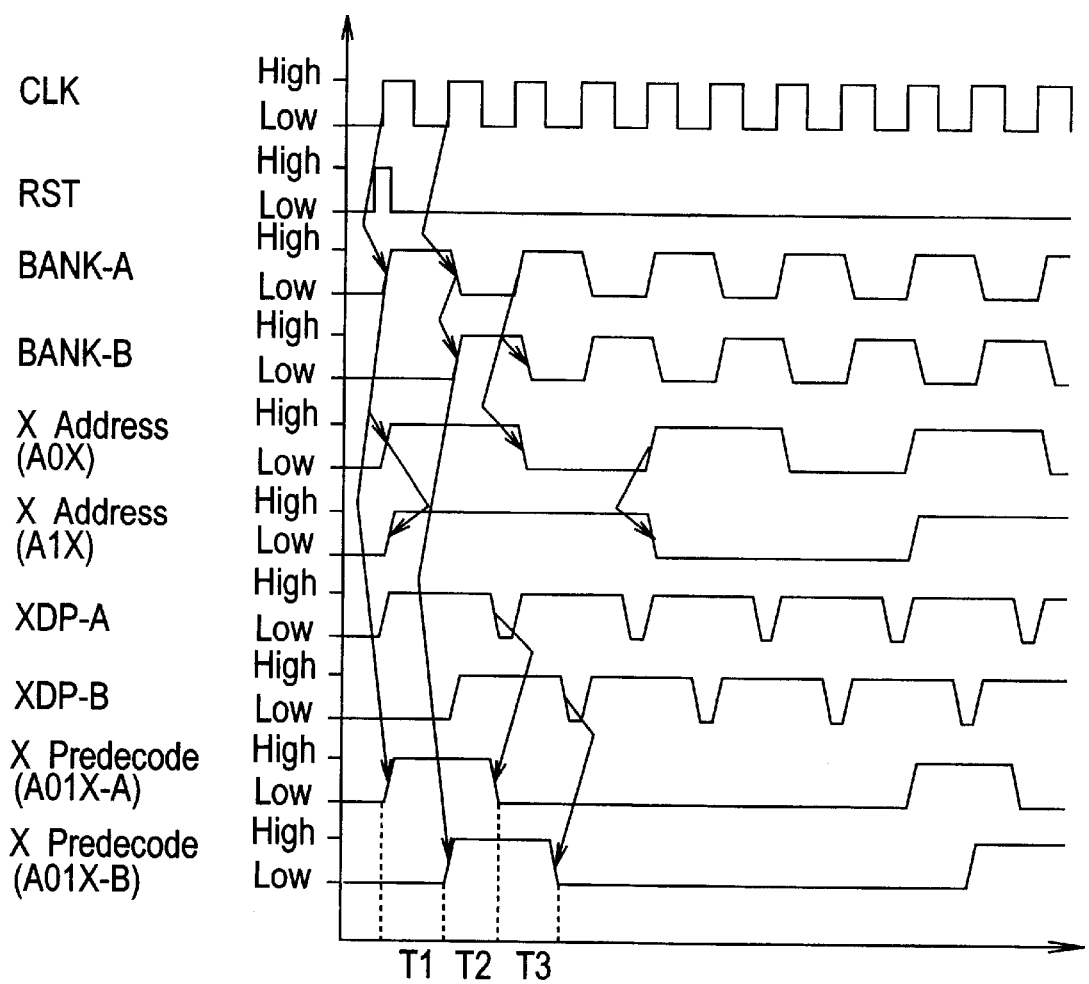
FIG. 11 is an operational diagram of the semiconductor storage device of the second embodiment.

As FIG. 11 shows, the X address to be output from the address counter 46 counts up at the rise of the bank select signal BANK-A. In the bank A, when each signal BANK-A, A0X, A1X and XDP-A rises, NMOS1, NMOS2 and NMOS3 of the above mentioned third basic circuit 64 turn ON, PMOS1 turns OFF, and the signal at the tenth node nd10 falls. By this, the X predecoding signal A01X-A to be output from the twelfth inverter INV12 rises. Then the signal BANK-A falls and the X predecoding signal A01X-A is latched by the thirteenth inverter INV13. During the period T1, from the rise of the signal BANK-A to the fall of the signal BANK-A, a read operation is executed to the address No.0, for example, of the memory cell array 34a.

When the bank select signal BANK-A next rises, the bank select signal BANK-B rises, and in the bank B, the X predecoding signal A01X-B rises at the rise of the signal BANK-B and the signal XDP-B, just like the bank A. Then the signal BANK-B falls, but the X predecoding signal A01X-B is latched. During the period T2, from the rise of the signal BANK-B to the fall of the BANK-B, a read operation is executed to the address No.0, for example, of the memory cell array 34b. Also during this period T2, the X predecoding signal A01X-A is latched in the rise state in the bank A, as mentioned above. Therefore a write operation is executed to the address No.0 of the memory cell array 34a during this period T2.

When the signal XDP-A next falls, the signal at the eleventh node nd11 in the third basic circuit 64 rises, and the X predecoding signal A01X-A falls accordingly. Then the X address, which is output from the address counter 46, is counted up at the rise of the signal BANK-A. In the bank B, on the other hand, the X predecoding signal A01X-B is latched in the rise state until the signal XDP-B falls. Therefore, during the period T3, from the fall of the signal BANK-A to the rise of the signal BANK-A, a read operation is executed to the address No.1 of the memory cell array 34a, and a write operation is also executed to the address No.0 of the memory cell array 34b.

In this way, the predecoder in each bank latches the address until the write operation ends. Therefore when the address output from the address counter 46 is counted up, a read operation is executed to the address after the count up in one bank, but in the other bank, a write operation is executed to the address before the count up during this time. In this way, a line memory operation similar to the first embodiment can be implemented using one address counter. In addition, the layout area can be decreased for the space of one address counter compared with the circuit of the first embodiment.

[Third Embodiment]

Figure 12:
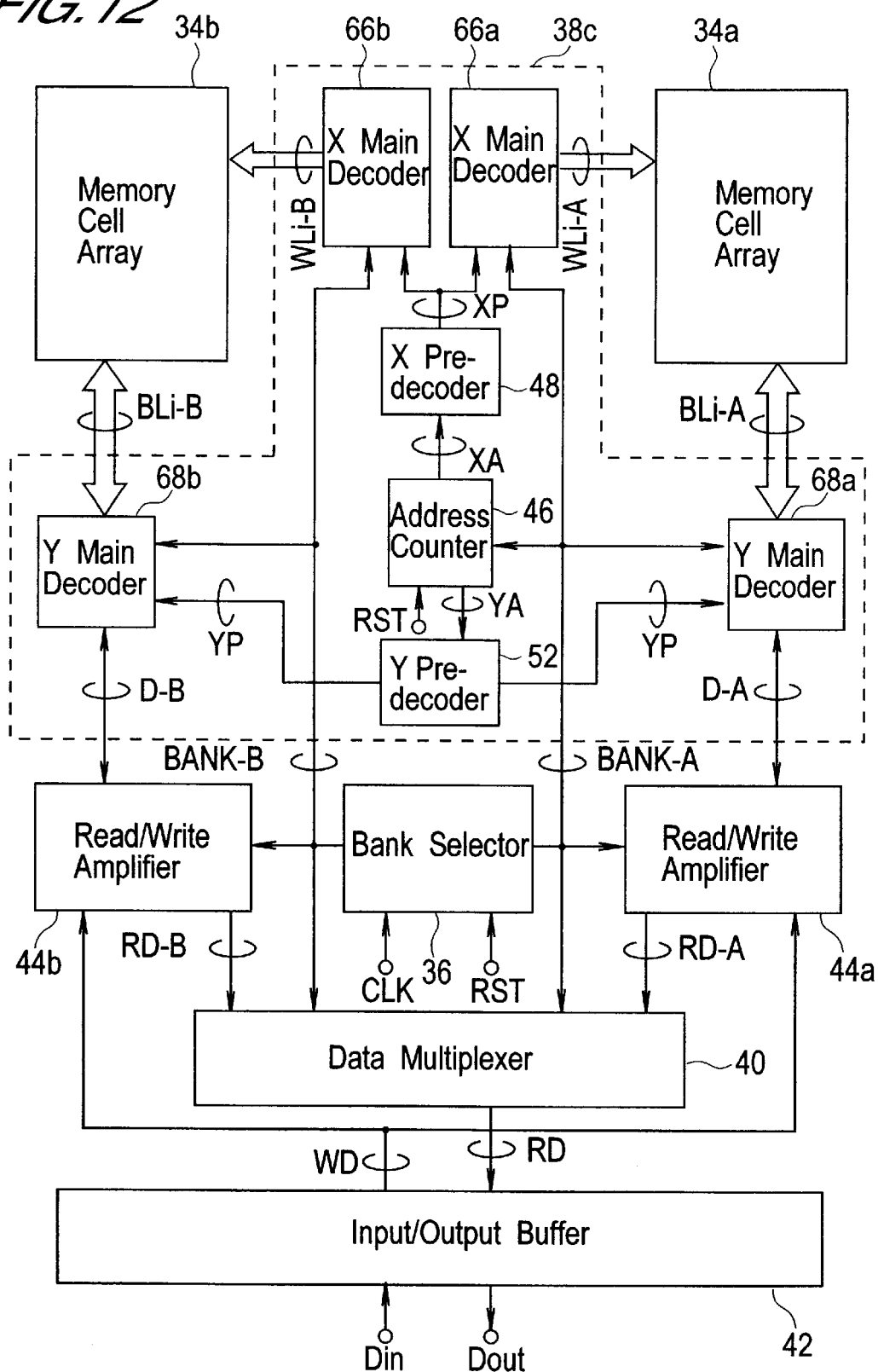
FIG. 12 is a diagram depicting a configuration of a semiconductor storage device of the third embodiment of the present invention.

FIG. 12 is a block diagram schematically depicting a configuration of a semiconductor storage device of the third embodiment. This semiconductor storage device has a different cell select circuit 38c, instead of the cell select circuit 38a described for the first embodiment. Since the rest of the configuration is the same as the first embodiment, description thereof will be omitted.

The above mentioned cell select circuit 38c is comprised of one address counter 46 as an address generation circuit, one X predecoder 48 and one Y predecoder 52. The cell select circuit 38c further comprises an X main decoder and a Y main decoder for memory cell arrays 34a and 34b respectively. Therefore the X decoder for the memory cell array 34a is comprised of an X predecoder 48 and an X main decoder 66a. The Y decoder for the memory cell array 34a is comprised of a Y predecoder 52 and a Y main decoder 68a. The X decoder for the memory cell array 34b is comprised of an X predecoder 48 and an X main decoder 66b. And the Y decoder for the memory cell array 34b is comprised of a Y predecoder 52 and a Y main decoder 68b.

In this embodiment, the X main decoders 66a and 66b have a latching function to continue selecting a word line for a predetermined period. The Y main decoders 68a and 68b have a latching function to continue selecting a bit line for a predetermined period.

Figure 13:
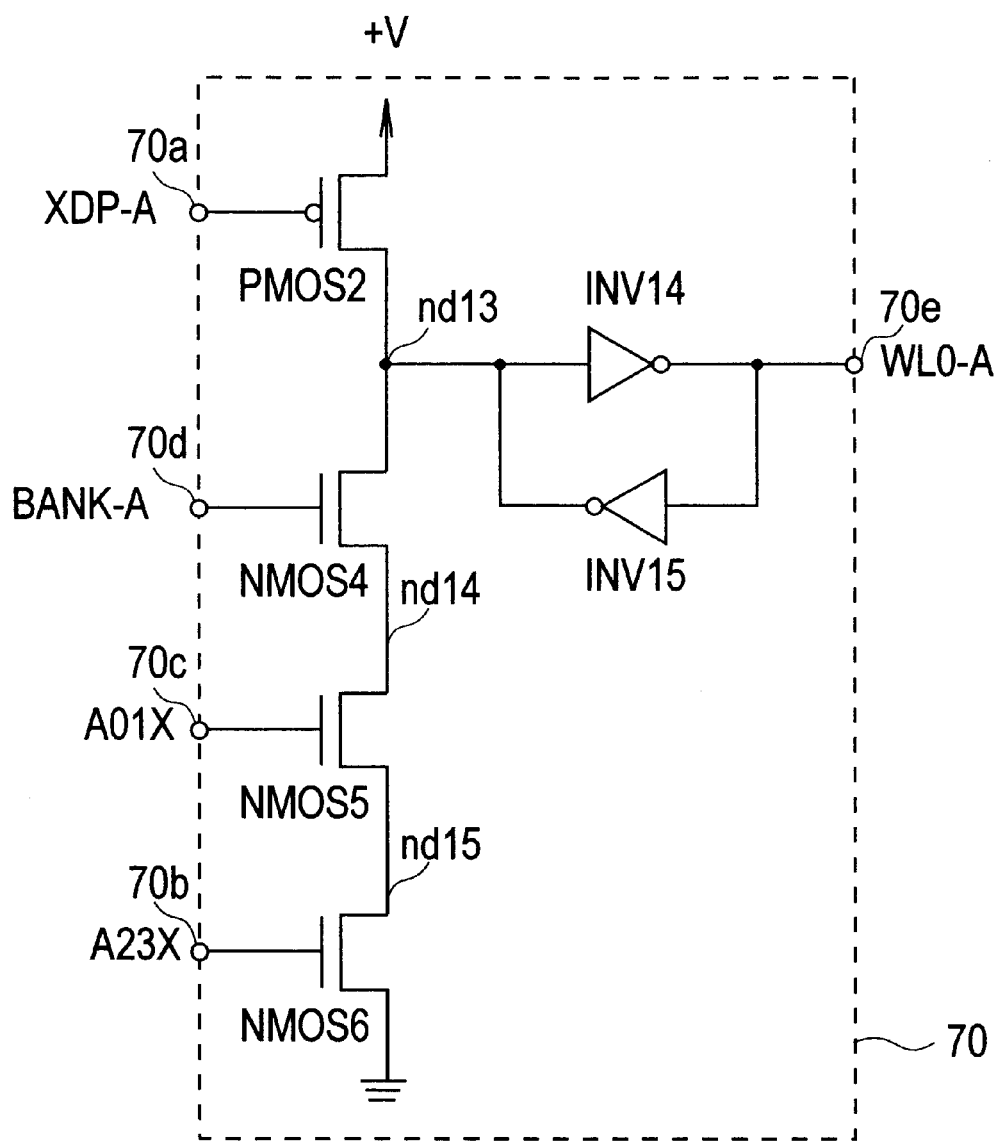
FIG. 13 is a diagram depicting a configuration of a main decoder of the third embodiment.

FIG. 13 is a circuit diagram depicting a configuration example of the X main decoder 66a. The configuration of the X main decoder 66a is the same as the configuration of the predecoder described in FIG. 10. In other words, the X main decoder 66a in FIG. 13 has a fourth basic circuit 70 which is comprised of one PMOS transistor, three NMOS transistors and two inverters. The channels of these transistors, PMOS2, NMOS4, NMOS5 and NMOS6 are sequentially connected in a series between the power supply (+V) and the ground. The connection point of the PMOS transistor PMOS2 and NMOS4 is the thirteenth node nd13. The gate electrode of the transistor PMOS2 is connected to the input terminal 70a where the X decoder precharge XDP-A is input. The connection point of NMOS4 and NMOS5 is the fourteenth node nd14, and the connection point of NMOS5 and NMOS6 is the fifteenth node nd15. The channel of the NMOS transistor NMOS6 is connected between the ground and the fifteenth node nd15, and the gate electrode is connected to the input terminal 70b where the X predecoding signal A23X is input. The channel of the NMOS transistor NMOS5 is connected between the fourteenth node nd14 and the fifteenth node nd15, and the gate electrode is connected to the input terminal 70c where the X predecoding signal A01X is input. The channel of the NMOS transistor NMOS4 is connected between the thirteenth node nd13 and the fourteenth node nd14, and the gate electrode is connected to the input terminal 70d where the signal BANK-A is input. The input terminal of the fourteenth inverter INV14 is connected to the thirteenth node nd13, and the output terminal is connected to the output terminal 70e where a predetermined word line WL0-A is connected. The output terminal of the fifteenth inverter INV15 is connected to the thirteenth node nd13, and the input terminal is connected to the output terminal 70e, so as to latch the selection of the word line WL0-A.

This circuit 70 controls the rise of the word line WL0-A by the bank select signal BANK-A, and controls the fall of the signal at the word line WL0-A by the X decoder precharge signal XDP-A. This circuit 70 latches the previous potential when both signals BANK-A and XDP-A are not activated (or are not supplied thereto). The X decoder precharge signal XDP-A rises at almost the same timing as the signal BANK-A, and falls just before the rise of the next signal BANK-A.

The actual X main decoder 66a is comprised of a required number of the fourth basic circuits 70 according to the memory capacity. The configuration of the other main decoders, that is, the X main decoder 66b, the Y main decoder 68a and the Y main decoder 68b, is the same as the configuration of the above mentioned X main decoder 66a. And the X main decoder 66b, for example, controls the word line WL0-B based on the X predecoding signals A01X and A23X generated by the X predecoder 48. In other words, the rise of a signal at the word line WL0-B is controlled by the bank select signal BANK-B, and the fall of a signal at the word line WL0-B is controlled by the X decoder precharge signal XDP-B.

The operation of this semiconductor storage device will now be described with reference to the timing chart in FIG. 14. Since operations other than the cell select circuit 38c are the same as the case of the first embodiment, description thereof will be omitted.

Figure 14:
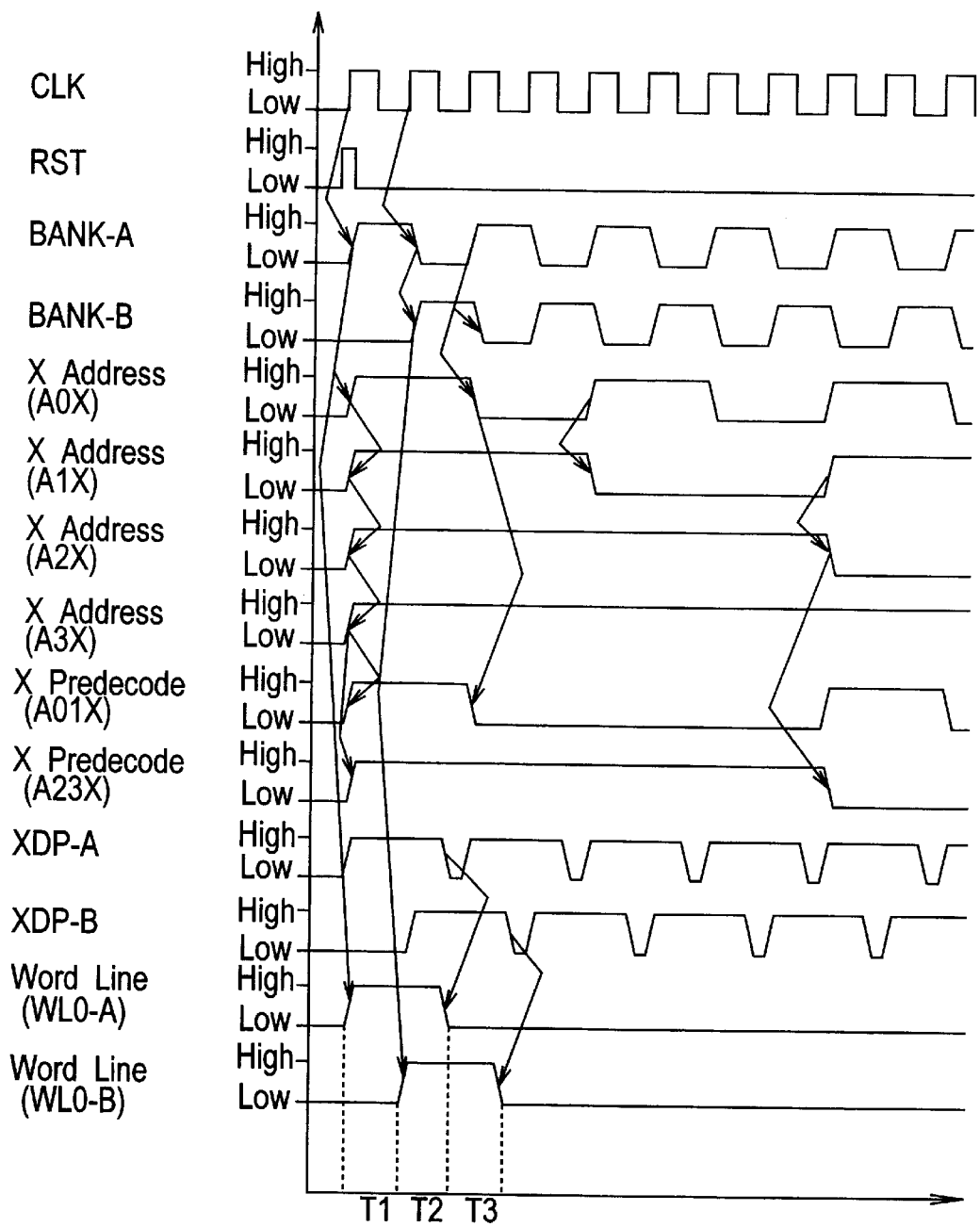
FIG. 14 is an operational diagram of the semiconductor storage device of the third embodiment.

As FIG. 14 shows, the X address to be output from the address counter 46 counts up at the rise of the bank select signal BANK-A. And the X address after count up is decoded by the X predecoder 48, and the X predecoding signal is output. In the bank A, when each signal BANK-A, A01X, A23X and XDP-A rises, NMOS4, NMOS5 and MNOS6 of the above mentioned fourth basic circuit 70 turn ON and PMOS2 turns OFF, and the signal at the thirteenth node nd13 falls. And a signal at the word line WL0-A rises by the fourteenth inverter INV14. Then the signal BANK-A falls but the selection of the word line WL0-A is latched by the fifteenth inverter INV15. During this period T1, from the rise of the bank select signal BANK-A to the fall of the signal BANK-A, a read operation is executed to the address No.0, for example, of the memory cell array 34a.

When the bank select signal BANK-A next falls, the bank select signal BANK-B rises, and in the bank B, a signal rises at the word line WL0-B at the rise of the signal BANK-B and the rise of the signal XDP-B, just like the bank A. Then the signal BANK-B falls, but the selection of the word line WL0-B is latched. During the period T2, from the rise of the signal BANK-B to the fall of the signal BANK-B, a read operation is executed to the address No.0, for example, of the memory cell array 34b. Also during the period T2, the signal at the word line WL0-A is latched in the rise status in the bank A, as mentioned above. Therefore a write operation is executed to the address No.0 of the memory cell array 34a during this period T2.

When the signal XDP-A next falls, the thirteenth node nd13 in the fourth basic circuit 70 rises, and the signal at the word line WL0-A falls accordingly. Then the X address, which is output from the address counter 46, is counted up at the rise of the signal BANK-A. In the bank B, on the other hand, the signal at the word line WL0-B is latched in the rise state until the signal XDP-B falls. Therefore during the period T3, from the fall of the signal BANK-A to the fall of the signal BANK-A, a read operation is executed to the address No.1 of the memory cell array 34a, and a write operation is also executed to the address No.0 of the memory cell array 34b.

In this way, the main decoder in each bank latches the address until the write operation in each bank ends. Therefore when the address output from the address counter 46 is counted up, a read operation is executed to the address after the count up in one bank, but in the other bank, a write operation is executed to the address before the count up during this time. In this way, a line memory operation similar to the first embodiment can be implemented using one address counter, one X predecoder and one Y predecoder. In addition, the layout area can be decreased for the space of one address counter, one X predecoder and one Y predecoder compared with the circuit of the first embodiment.

[Fourth Embodiment]

Figure 15:
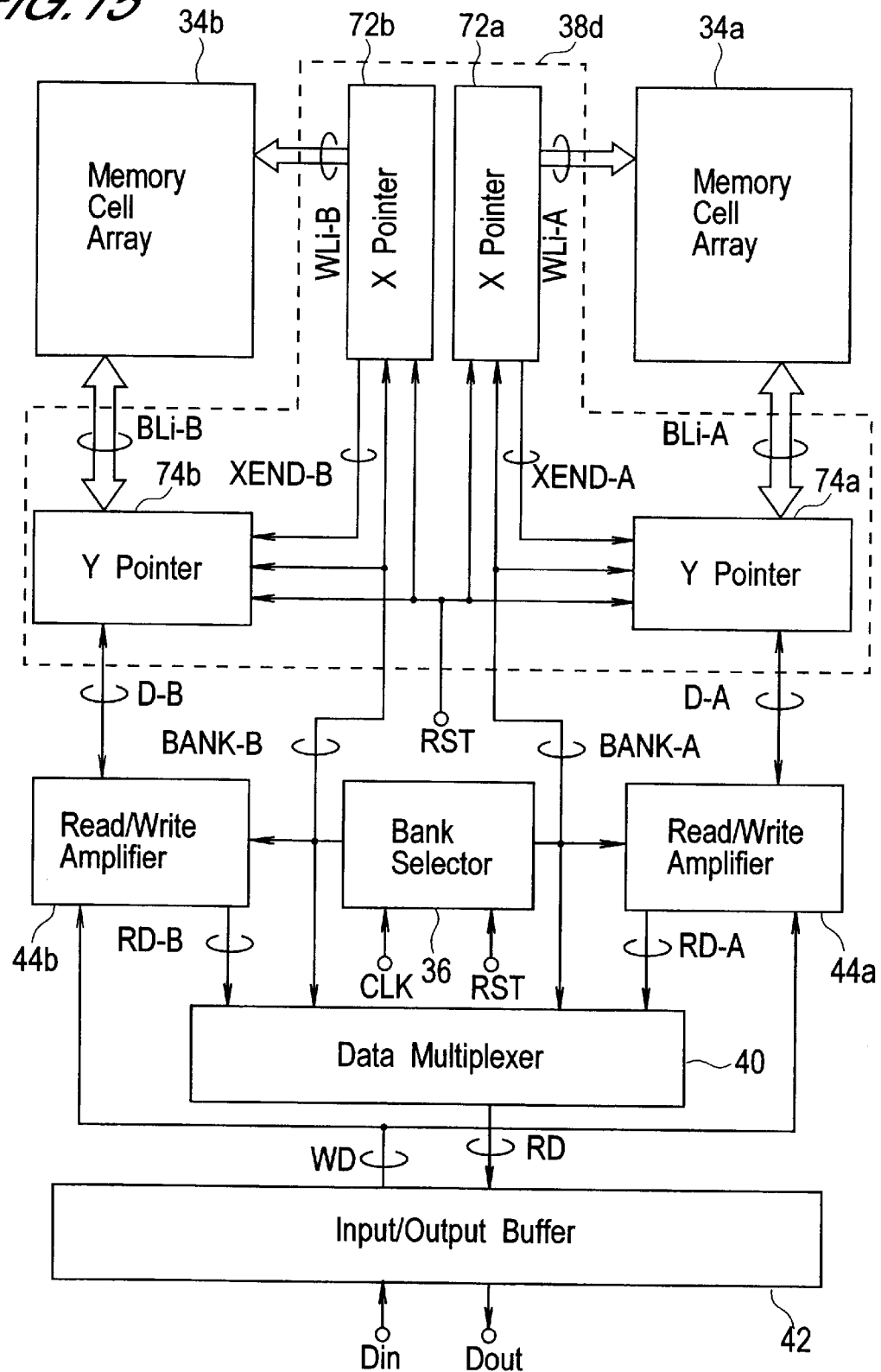
FIG. 15 is a diagram depicting a semiconductor storage device of the fourth embodiment of the present invention.

FIG. 15 is a block diagram schematically depicting a configuration of a semiconductor storage device of the fourth embodiment. This semiconductor storage device has a different cell select circuit 38d, instead of the cell select circuit 38a described for the first embodiment. Since the rest of the configuration is the same as the first embodiment, description thereof will be omitted.

The above mentioned cell select circuit 38d has an X pointer (row pointer) which sequentially selects a predetermined word line according to the bank select signal, and a Y pointer (column pointer) which sequentially selects a predetermined bit line according to the bank select signal for each memory cell array. In other words, the cell select circuit 38d has an X pointer 72a and a Y pointer 74a for the memory cell array 34a, and an X pointer 72b and a Y pointer 74b for the memory cell array 34b.

Figure 16:
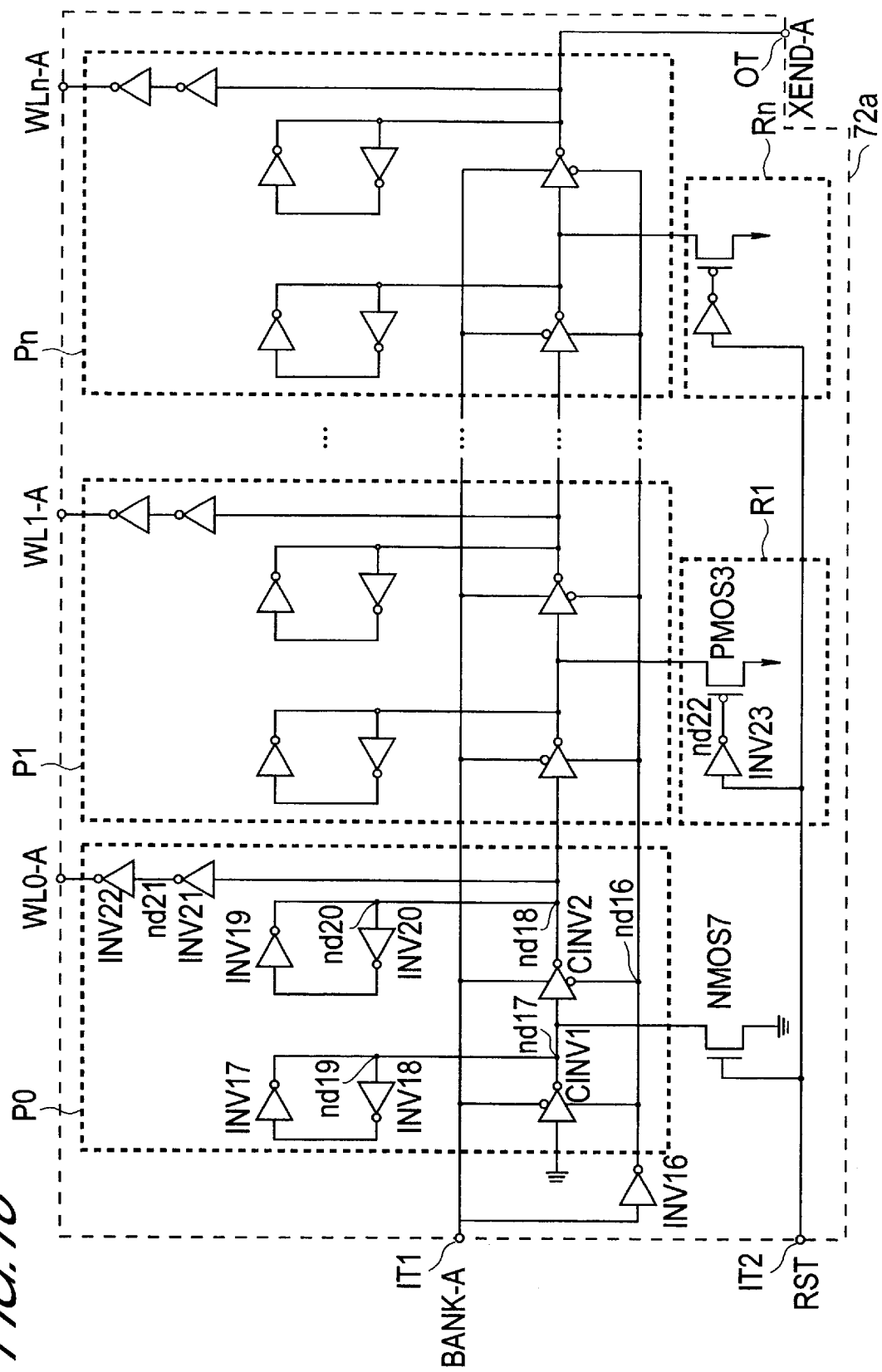
FIG. 16 is a diagram depicting a configuration of an X pointer constituting the semiconductor storage device of the fourth embodiment.

FIG. 16 is a circuit diagram depicting a configuration example of the X pointer 72a. The X pointer 72a in FIG. 16 is comprised of n (n is a number of word lines) number of point circuits Pi (i=0, 1, . . . , n), (n−1) number of reset circuits Ri (i=1, 2, . . . , n), one NMOS transistor NMOS7 and one inverter INV16. This X pointer 72a further comprises an input terminal IT1 where the bank select signal BANK-A is input, an input terminal IT2 where the reset signal RST is input, and an output terminal OT where the final point signal XEND-A is output.

P0 is a point circuit at the first stage, P1–Pn−1 are point circuits at the intermediate stage, and Pn is a point circuit at the final stage. Each point circuit has the same circuit configuration, and is controlled by the bank select signal BANK-A and a reverse phase signal which is generated by inverting this bank select signal by the inverter INV15. The point circuit Pi is comprised of two clocked inverters and six inverters.

Here, the pointer P0 at the first stage will be described as an example. The input terminal of the first clocked inverter CINV1 is connected to the ground, and the output terminal thereof is connected to the input terminal of the second clocked inverter CINV2. The output terminal of the clocked inverter CINV2 is connected to the input terminal of the first clocked inverter in the next stage. The respective two gate electrodes of the clocked inverters CINV1 and 2 are connected to the input terminal IT1 and the output terminal of the sixteenth inverter INV16. The connection mid-point of the output terminal of the inverter INV16 and the gate elecctrode of each clocked inverter is the sixteenth node nd16. The connection mid-point of the output terminal of the clocked inverter CINV1 and the input terminal of the clocked inverter CINV2 is the seventeenth node nd17. The connection mid-point between the output terminal of the clocked inverter CINV2 and the input terminal of the clocked inverter CINV1 at the next stage is the eighteenth node nd18.

The seventeenth node nd17 is connected to the output terminal of the seventeenth inverter INV17 and the input terminal of the eighteenth inverter INV18, and the connection point thereof is the nineteenth node nd19. The input terminal of the inverter INV17 is connected to the output terminal of INV18. The eighteenth node nd18 is connected to the output terminal of the nineteenth inverter INV19 and the input terminal of the twentieth inverter INV20, and the connection point thereof is the twentieth node nd20. And the input terminal of the inverter INV19 is connected to the output terminal of INV20. The eighteenth node nd18 is connected to the input terminal of the twenty first inverter INV21, the output terminal of the twenty first inverter INV21 is connected to the input terminal of the twenty second inverter INV22, and the output terminal of the twenty second inverter INV22 is connected to the word line WL0-A.

The channel of the transistor NMOS1 outside the point circuit is connected between the seventeenth node nd17 and the ground, and the gate electrode of the transistor NMOS7 is connected to the input terminal IT2.

The clocked inverters CINV1 and CINV2 are controlled by the signal BANK-A and the reverse phase signal thereof. One clocked inverter CINV1 turns ON when the reverse phase signal at the sixteenth node nd16 is activated (or is supplied thereto). The other clocked inverter CINV2 is turned ON when the signal BANK-A is activated (or is supplied thereto). The inverters INV17 and INV18 latch the signal generated at the seventeenth node nd17. The inverters INV19 and INV20 latch the signal generated at the eighteenth node nd18. The inverters INV21 and INV22 drive so that the signal generated at the eighteenth node nd18 is sent to the word line WL0-A.

The input of the clocked inverter CINV1 of the point circuit P0 at the first stage is connected to the ground. The clocked inverter CINV1 of the point circuit Pi at the intermediate stage is connected to the output terminal of the clocked inverter CINV2 of the point circuit Pi−1 at the previous stage, and the output terminal of the clocked inverter CINV2 is connected to the input terminal of the clocked inverter CINV1 of the point circuit Pi+1 at the next stage. The output of the clocked inverter CINV2 of the point circuit Pn at the final stage is connected to the output terminal OT. The final point signal XEND-A, which is output from this output terminal OT, indicates the rise of the final word line WLn-A. The seventeenth node nd17 of the point circuit P0 at the first stage is connected to NMOS7, and the seventeenth node nd17 of the other point circuits Pi is connected to the PMOS3 of the reset circuit Ri. The above mentioned NMOS7 sets the signal at the seventeenth node nd17 of the point circuit P0 which generates the word line WL0-A to the ground level at the rise of the reset signal RST.

The above mentioned reset circuit Ri is comprised of one PMOS transistor PMOS3 and one twenty third inverter INV23. The signal RST is input to the twenty third inverter INV23. The connection point of the output terminal of the inverter INV23 and the gate electrode of PMOS3 is the twenty second node nd22. These reset circuits Ri reset the signal at the seventeenth node nd17 of the point circuit Pi.

The X pointer 72a constitutes a dynamic shift register type circuit which shifts the word line synchronizing with the rise of the signal BANK-A. The X pointer 72a, however, always rises a signal at the word line WL0-A after the signal RST rises. The configuration of the X pointer 72b, the Y pointer 74a and the Y pointer 74b is the same as the X pointer 72a. The X pointer 72b outputs the final point signal XEND-B according to BANK-B. The signal XEND-A, however, is input to the input terminal IT1 of the Y pointer 74a instead of the signal BANK-A. And the signal XEND-B is input to the input terminal IT1 of the Y pointer 74b instead of the signal BANK-B.

The operation of this semiconductor storage device will now be described with reference to the timing chart in FIG. 17. Since operations other than the cell select circuit 38d are the same as the case of the first embodiment, description thereof will be omitted.

Figure 17:
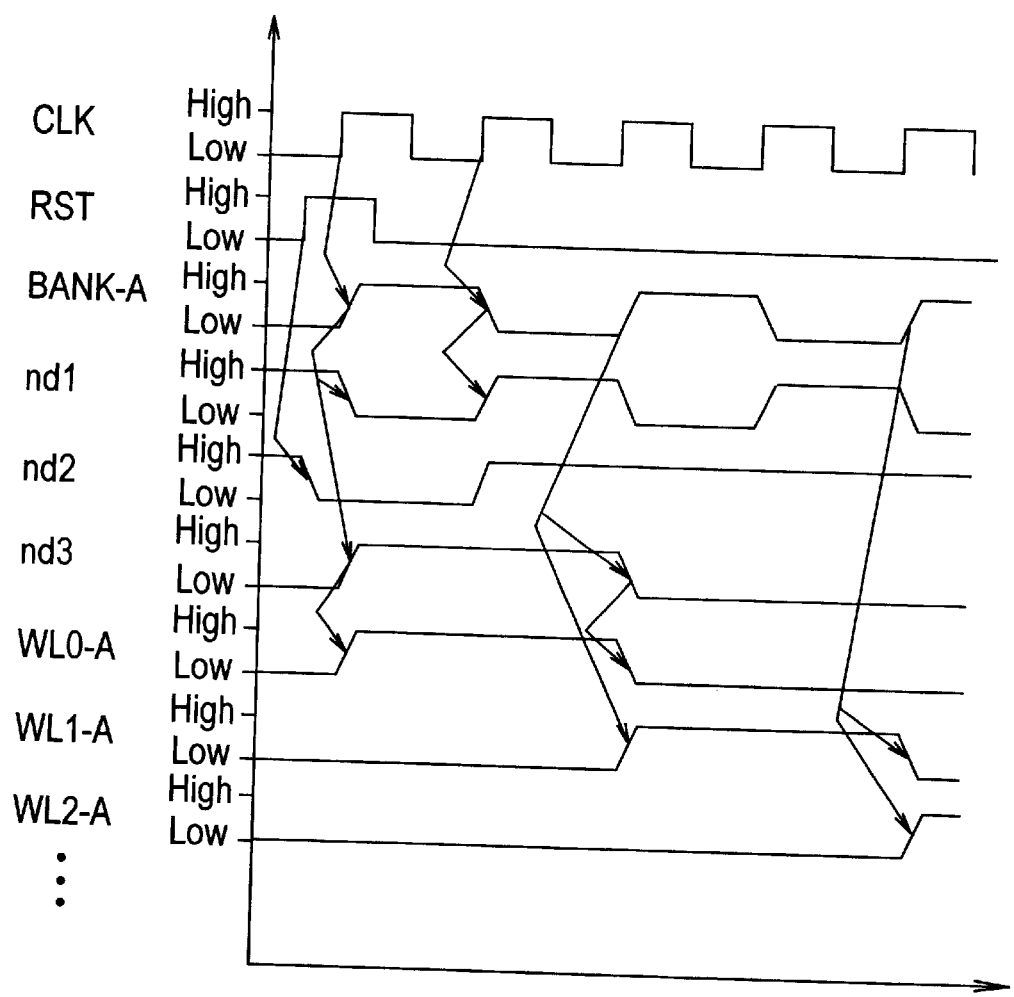
FIG. 17 is an operational diagram of the semiconductor storage device of the fourth embodiment.

As FIG. 17 shows, in the bank A, NMOS7 of the X pointer 72a turns ON at the rise of the reset signal RST, and a signal falls at the seventeenth node nd17. Then, when the signal BANK-A rises, a signal rises at the eighteenth node nd18, and a signal rises at the word line WL0-A. When the signal BANK-A falls, the clocked inverter CINV1 turns ON and a signal rises at the seventeenth node nd17. When the signal BANK-A rises again, the clocked inverter CINV2 turns ON, the signal at the eighteenth node nd18 falls, the signal at the WL0-A falls and the signal at WL1-A rises. Then the rise of the signal at the word line shifts synchronizing with the rise of the signal BANK-A. In the bank B, the same operation as bank A is also performed at the rise and fall of the signal BANK-B.

In this way, a line memory operation similar to the first embodiment can be implemented. In addition, control of the word line selection and bit line selection is easier compared with the circuit of the first embodiment.

[Fifth Embodiment]

Figure 18:
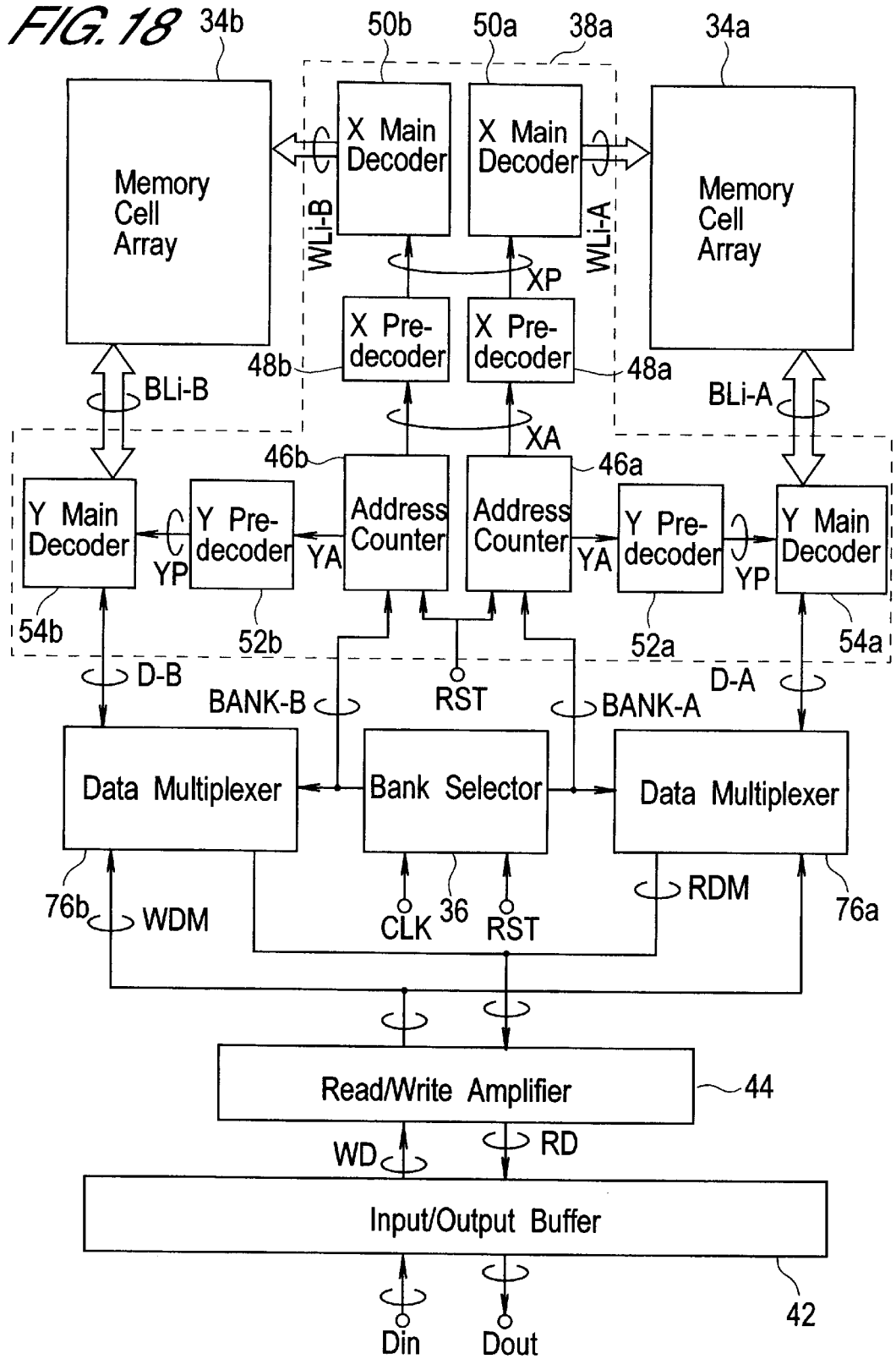
FIG. 18 is a diagram depicting a configuration of a semiconductor storage device of the fifth embodiment of the present invention.

FIG. 18 is a block diagram schematically depicting a configuration of a semiconductor storage device of the fifth embodiment. This semiconductor storage device is comprised of memory cell arrays 34a and 34b, a bank selector 36, a cell select circuit 38a, and an input/output buffer 42 described for the first embodiment. In addition, this semiconductor storage device further comprises a read/write amplifier 44 as an input/output data amplifier, and data multiplexers 76a and 76b as a data transfer circuit. Since the difference from the first embodiment is the read/write amplifier and the data multiplexer, these will be primarily described for this embodiment, and descriptions on other components will be omitted.

The data transfer circuit of this configuration example performs processing to transfer the read data from the memory cell array selected by the bank select signal to the read/write amplifier 44, and processing to transfer the write data sent from this read/write amplifier 44 to a predetermined memory cell array. In other words, the data transfer circuit transfers the read data from the memory cell arrays 34a and 34b to the read/write amplifier 44 alternately. The data transfer circuit transfers the data sent from the read/write amplifier 44 to the memory cell arrays 34a and 34b alternately.

The read/write amplifier 44 of this configuration example amplifies the write data to be sent from the input/output buffer 42 to the data transfer circuit, and the read data to be sent from the data transfer circuit to the input/output buffer 42.

In this configuration example, the semiconductor storage device has a data multiplexer 76a for the memory cell array 34a and a data multiplexer 76b for the memory call array 34b as the data transfer circuit. The semiconductor storage device of this configuration example also has the read/write amplifier 44 which is commonly used by both banks.

The above mentioned data multiplexer 76a performs processing to transfer the read data from the memory cell array 34a to the read/write amplifier 44, and processing to transfer the write data sent from the read/write amplifier 44 to the memory cell array 34a. This data multiplexer 76a is connected to the Y main decoder 54a by the data line D-A, and is connected to the read/write amplifier 44 by the read data line RDM.

When the bit line BLi-A is selected in the Y main decoder 54a, the data which is output to the bit line is input to the data multiplexer 76a via the data line D-A. The data multiplexer 76a outputs that data to the read data line RDM at a timing according to the bank select signal BANK-A. The data is amplified by the read/write amplifier 44, and is sent to the input/output buffer 42 as the read data RD.

The write data WD amplified by the read/write amplifier 44 is sent to the data multiplexer 76a by the write data line WDM. The data multiplexer 76a outputs the write data WD to the data line D-A according to the timing of the bank select signal BANK-A. The Y main decoder 54a selects the bit line BLi-A.

The above mentioned data multiplexer 76b performs processing to transfer the read data from the memory cell array 34b to the read/write amplifier 44, and processing to transfer the write data sent from the read/write amplifier 44 to the memory cell array 34b. This data multiplexer 76b is connected to the Y main decoder 54b by the data line D-B and is connected to the read/write amplifier 44 by the read data line RDM.

When the bit line BLi-B is selected in the Y main decoder 54b, the data which is output to the bit line is input to the data multiplexer 76b via the data line D-B. The data multiplexer 76b outputs the data to the read data line RD at a timing according to the bank select signal BANK-B. The data is amplified by the read/write amplifier 44, and is sent to the input/output buffer 42 as the read data RD.

The write data WD amplified by the read/write amplifier 44 is sent to the data multiplexer 76b by the write data line WDM. The data multiplexer 76b outputs the write data WD to the data line D-B according to the timing of the bank select signal BANK-B. The Y main decoder 54b selects the bit line BLi-B.

Figure 19:
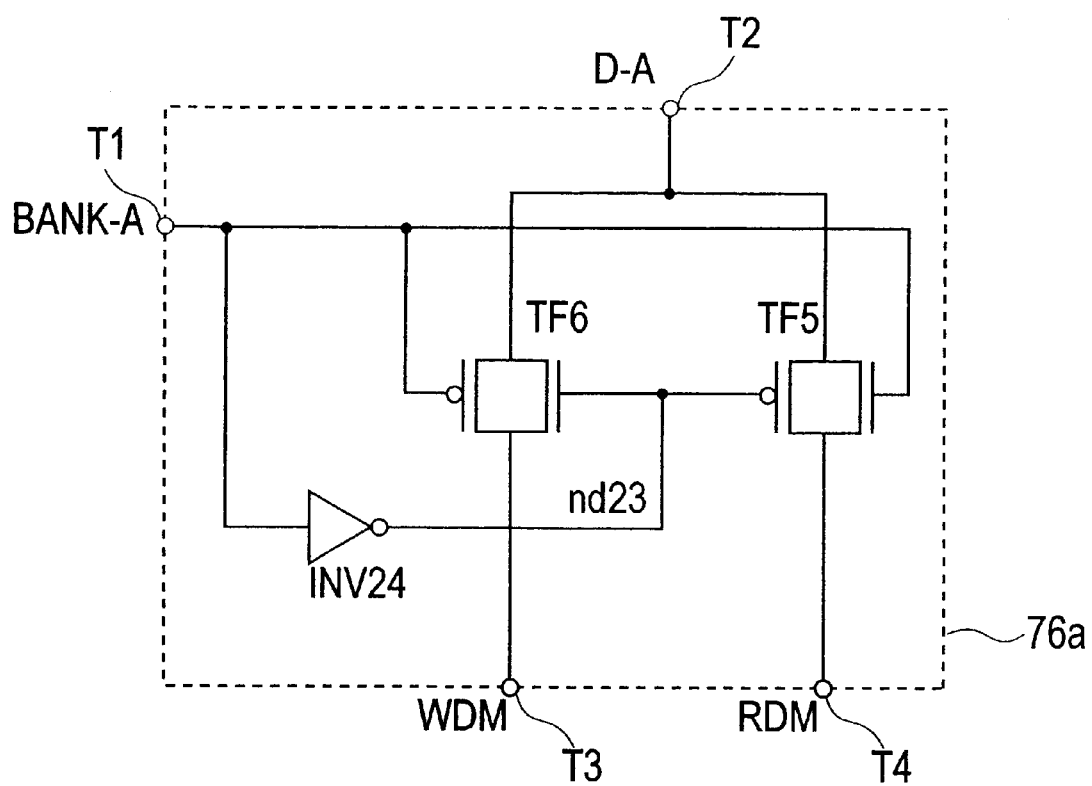
FIG. 19 is a diagram depicting a configuration of a data multiplexer of the fifth embodiment.

FIG. 19 is a circuit diagram depicting a configuration example of the data multiplexer 76a. The data multiplexer 76a in FIG. 19 is comprised of one inverter and two transfer gates. This data multiplexer 76a has a terminal T1 where the bank select signal BANK-A is input, a terminal T2 where the data line D-A is connected, a terminal T3 where the write data line WDM is connected, and a terminal T4 where the read data line RDM is connected.

The twenty fourth inverter INV24, where the input terminal is connected to the terminal T1, outputs the reverse phase signal of the signal BANK-A. The transfer gate TF5 is connected between the terminals T2 and T4, where the signal BANK-A is input to one gate terminal of the transfer gate TF5 and the reverse phase signal from the inverter INV24 is input to the other gate terminal. This TF5 turns ON when the signal BANK-A is activated (or is supplied thereto). The transfer gate TF6 is connected between the terminals T2 and T3, where the signal BANK-A is input to one gate terminal of the transfer gate TF6 and the reverse phase signal is input to the other gate terminal. This TF6 turns ON when the reverse phase signal is activated (or is supplied thereto). The connection point of the inverter INV23 and the transfer gates TF5 and TF6 is the twenty third node nd23.

The data multiplexer 76a is a circuit to connect the data line D-A and the read data line RDM while the signal BANK-A is high, and to connect the data line D-A and the write data line WDM while the signal BANK-A is low. The other data multiplexer 76b has the same circuit configuration, and this data multiplexer 76b connects the data line D-B and the read data line RDM while the signal BANK-B is high, and connects the data line D-B and the write data line WDM while the signal BANK-B is low.

Figure 20:
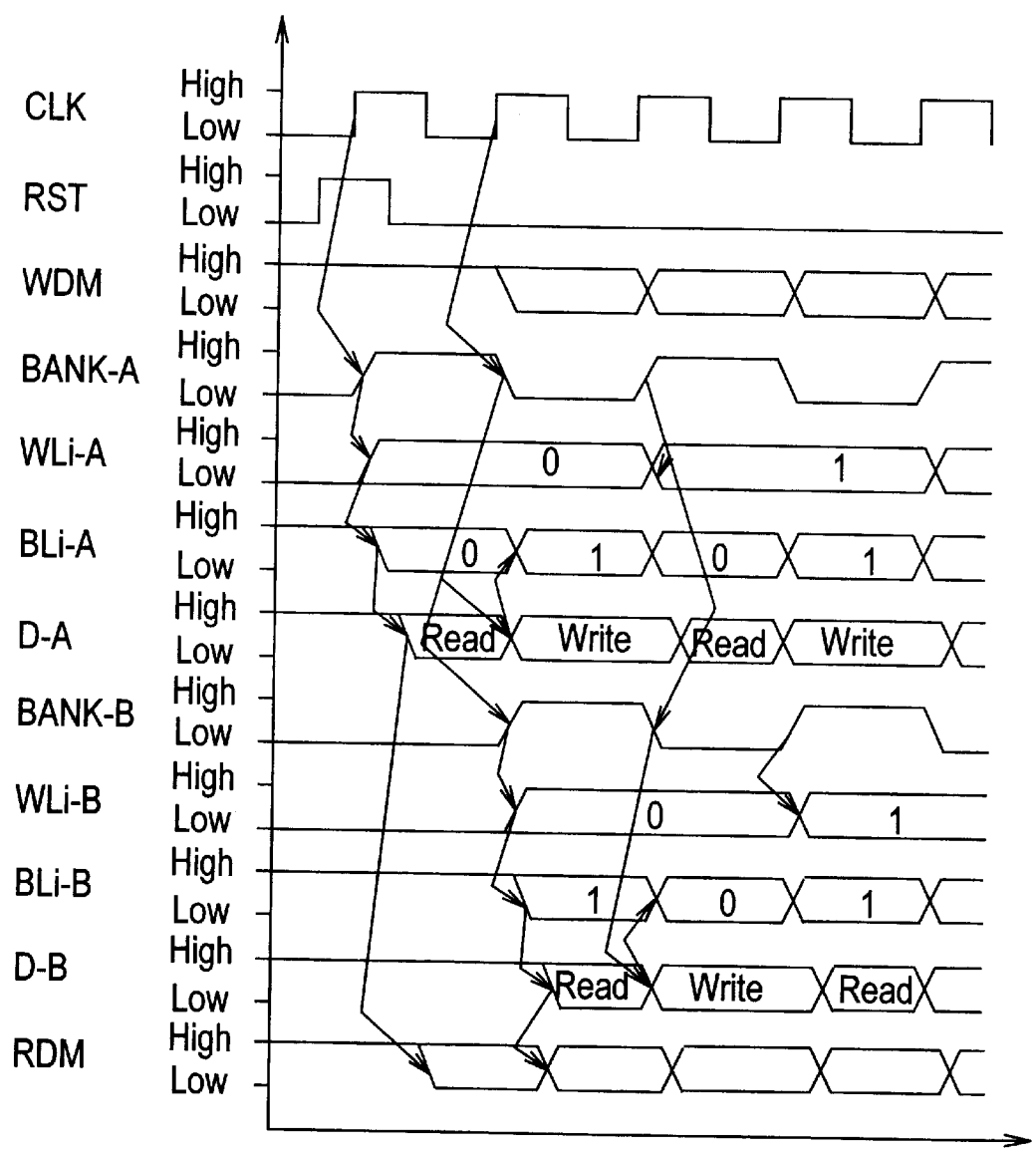
FIG. 20 is an operational diagram of the semiconductor storage device of the fifth embodiment.

The operation of this semiconductor storage device will now be described with reference to the timing chart in FIG. 20. Since operations other than the data transfer circuit are the same as the case of the first embodiment, description thereof will be omitted.

In the bank A, the transfer gate TF5 of the data multiplexer 76a turns ON at the rise of the bank select signal BANK-A. By this, the data line D-A and the read data line RDM are connected, and the stored data of the memory cell array 34a is output to the output terminal Dout via the read/write amplifier 44. At the fall of the signal BANK-A, the transfer gate TF6 turns ON. By this, the data line D-A and the write data line WDM are connected and data is written to the memory cell array 34a.

In the bank B, on the other hand, a read and a write operation to the memory cell array 34b are executed at the rise and fall of the bank select signal BANK-B. In the entire device, an operation to connect the data line D-B and the write data line WDM as soon as the data line D-A and the read data line RDM are connected, and an operation to connect the data line D-A and the write data line WDM as soon as the data line D-B and the read data line RDM are connected are repeated.

In this way, a line memory operation similar to the first embodiment can be implemented. Since the read/write amplifier is commonly used for both banks, the layout area can be decreased for the space of one read/write amplifier compared with the circuit of the first embodiment.

[Sixth Embodiment]

Figure 21:
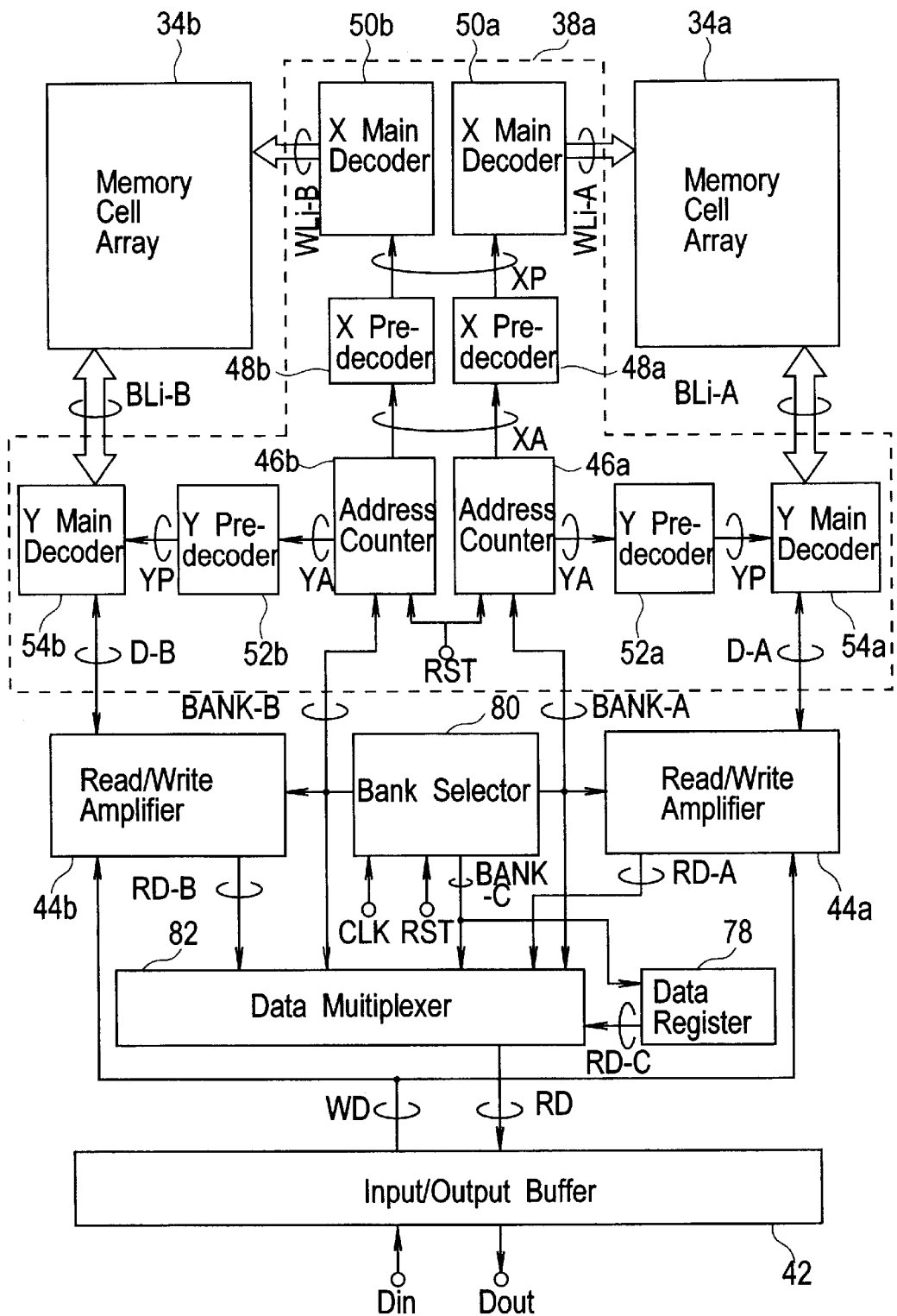
FIG. 21 is a diagram depicting a configuration of the semiconductor storage device of the sixth embodiment of the present invention.

FIG. 21 is a block diagram depicting a configuration of a semiconductor storage device of the sixth embodiment. This semiconductor storage device has a data register 78 in addition to the configuration described for the first embodiment. Instead of the bank selector 36 of the first embodiment, this semiconductor storage device has a bank selector 80 where a new circuit is added to the selector 36. Also, instead of the data multiplexer 40 of the first embodiment, this semiconductor storage device has a data multiplexer 82 where a new circuit is added to the multiplexer 40. Since the difference from the first embodiment is the data register, bank selector and the data multiplexer, these will be primarily described for this embodiment, and description on other components will be omitted.

Figure 22:
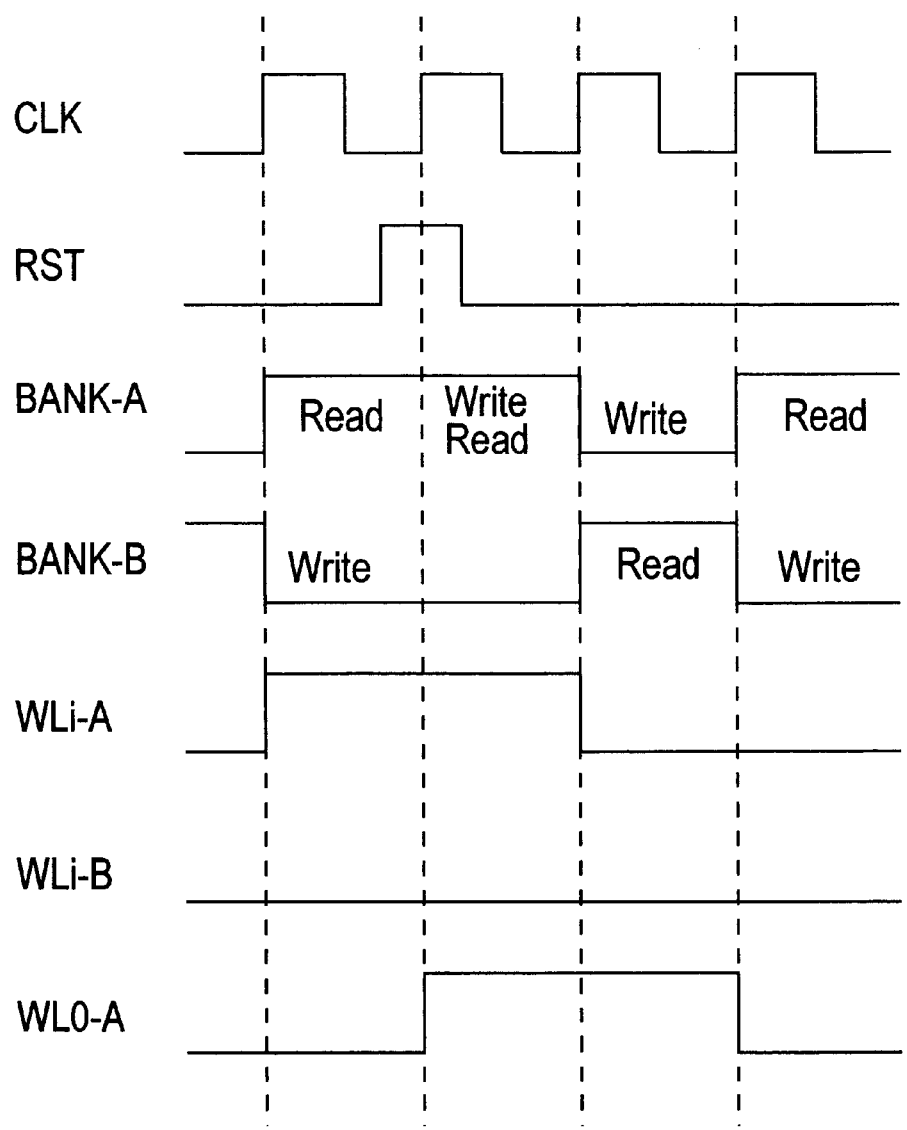
FIG. 22 is an operational diagram of the semiconductor storage device of the sixth embodiment.

The data register 78 is incorporated for the following reason. FIG. 22 is a timing chart depicting the operation of the semiconductor storage device of the sixth embodiment. As FIG. 22 shows, when a reset (rise of RST) is executed during a read operation of the bank A, the high level periods of the word lines WLi-A and WLi-0 overlap, double word lines are selected, and operation errors occur. For example, in the bank A, a read operation and a write operation are executed at the same time. So the reset signal cannot rise while the bank A is in a read operation. Therefore this semiconductor storage device incorporates the data register 78 for the first bit so that the reset signal RST can rise at any timing.

The above mentioned bank selector 80 has a circuit to generate a bank select signal BANK-C to select the data register 78, in addition to the circuit to generate the signals BANK-A and BANK-B (the bank selector 36 described for the first embodiment) to select the memory cell arrays 34a and 34b.

Figure 23:
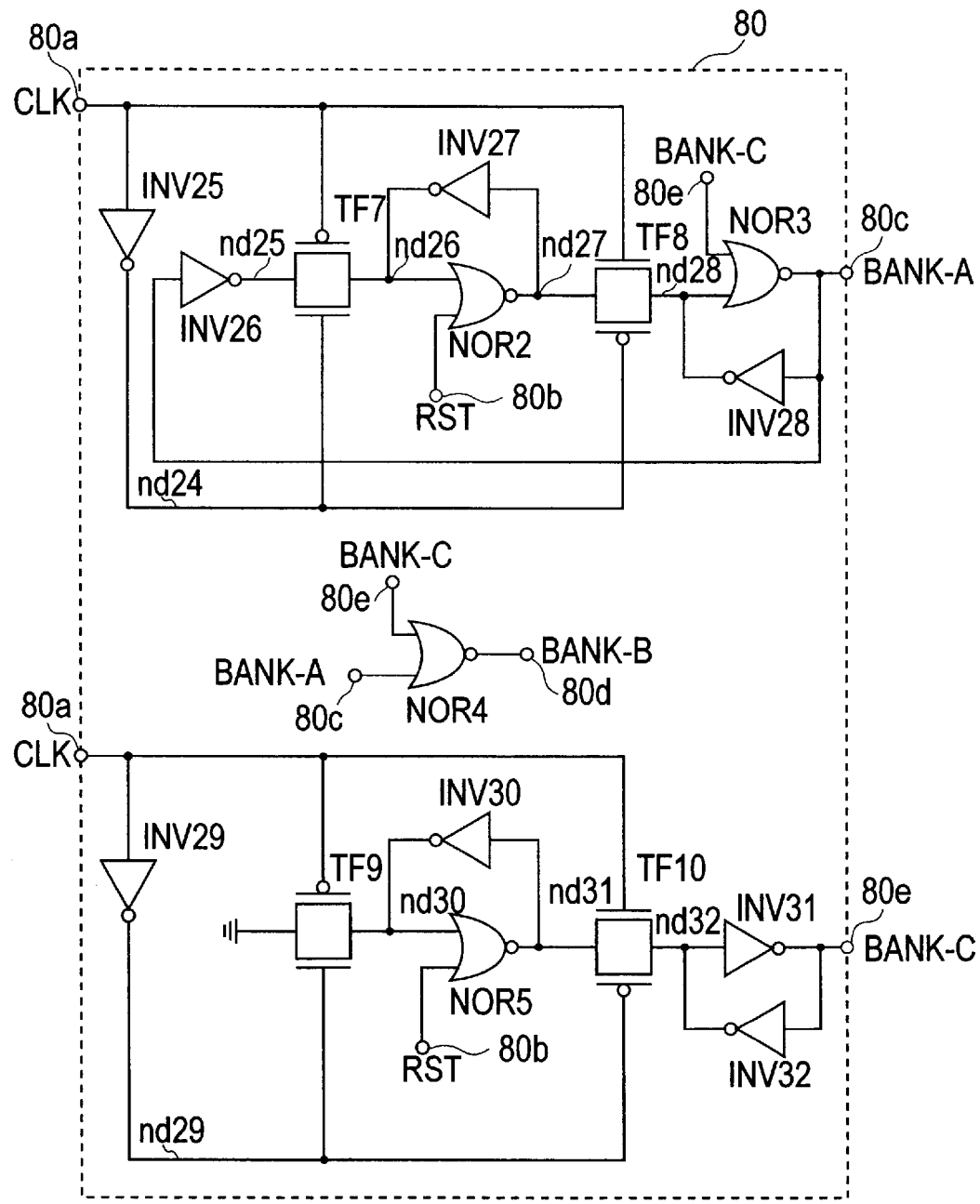
FIG. 23 is a diagram depicting a configuration of a bank selector of the sixth embodiment.

FIG. 23 is a circuit diagram depicting a configuration example of the bank selector 80. As FIG. 23 shows, the circuit to generate the signal BANK-A corresponds to a circuit where the inverter INV4 of the bank selector 36 shown in FIG. 4 is replaced with a NOR circuit NOR3 having the signal BANK-C as an input. The circuit to generate the signal BANK-B corresponds to a circuit where the inverter INV6 of the bank selector 36 shown in FIG. 4 is replaced with a NOR circuit NOR4 having the signal BANK-C as an input. Therefore the circuit to generate the signal BANK-C corresponds to the circuit where the inverter INV2 is eliminated from the circuit to generate the signal BANK-A of the bank selector 36 shown in FIG. 4, and a signal at a ground level is used for an input instead of the signal at the node nd2. This circuit to generate the signal BANK-C always rises the signal BANK-C immediately after a reset, then alternately rises the signals BANK-B and BANK-A in this sequence. Some configurations of each generation circuit is therefore common with the circuit described in FIG. 4.

As FIG. 23 shows, the bank selector 80 is comprised of a clock port 80a where the clock signal CLK is input, a reset port 80b where the reset signal RST is input, and a first, second and third output ports 80c, 80d and 80e where the bank select signals BANK-A, BANK-B and BANK-C are output respectively.

This bank selector 80 is comprised of eight inverters, four transfer gates and four NOR circuits.

The twenty fifth inverter INV25, where the clock port 80a is connected to the input terminal, and the output terminal is connected to the transfer gates TF7 and TF8, outputs the reverse phase signal of the clock signal CLK to the twenty fourth node nd24, which is a connection point of the twenty eighth inverter and transfer gates TF7 and TF8.

The seventh transfer gate TF7 is connected between the output terminal of the twenty sixth inverter INV26 and one input terminal of the NOR circuit NOR2. The connection point of TF7 and INV26 is the twenty fifth node nd25, and the connection point with NOR2 is the twenty sixth node nd26. The transfer gate TF7 also has gates where the clock signal CLK and the reverse phase signal thereof are input, and turns ON when this reverse phase signals is activated.

The eighth transfer gate TF8 is connected between the output terminal of the NOR circuit NOR2 and one input terminal of the NOR circuit NOR3. The connection point of TF8 and the NOR circuit NOR2 is the twenty seventh node nd27, and the connection point of TF8 and the NOR circuit NOR3 is the twenty eighth node nd28. This TF8 has gates where the clock signal CLK and the reverse phase signal thereof are input, and turns ON when this clock signals is activated.

In the second NOR circuit NOR2, the reset port 80b and the twenty sixth node nd26 are connected to the input terminals respectively, and the twenty seventh node nd27 is connected to the output terminal.

In the twenty sixth inverter INV26, the first output port 80c is connected to the input terminal, and the twenty fifth node nd25 is connected to the output terminal.

The twenty seventh inverter INV27 is connected between the twenty sixth node nd26 and the twenty seventh node nd27, and latches a signal generated at the twenty seventh node nd27.

In the third NOR circuit NOR3, the twenty eighth node nd28 and the third output port 80e are connected to the input terminals, and the first output port 80c is connected to the output terminal.

The twenty eighth inverter INV28, where the first output port 80c is connected to the input terminal, and the twenty eighth node nd28 is connected to the output terminal, latches a signal generated at the first output port 80c.

In the fourth NOR circuit NOR4, the first output port 80c and the third output port 80e are connected to the input terminals, and the second output port 80d is connected to the output terminal.

The twenty ninth INV29, where the clock port 80a is connected to the input terminal, outputs the reverse phase signal of the clock signal CLK to the output terminal. The output terminal of this INV29 is connected to TF9 and TF10. This connection point is the twenty ninth node nd29.

The ninth transfer gate TF9 is connected between the ground and one input terminal of the fifth NOR circuit NOR5, and this connection point is the thirtieth node nd30. This TF9 has gate terminals where the clock signal CLK and the reverse phase signal thereof are input, and turns ON when this reverse phase signal is activated (or is supplied thereto).

The tenth transfer gate TF10 is connected between the output terminal of NOR5 and the input terminal of INV31. The former connection point is the thirty first node nd31 and the latter connection point is the thirty second node nd32. This TF10 has gate terminals where the clock signal CLK and the reverse phase signal thereof are input, and turns ON when this clock signal is activated.

In the fifth NOR circuit NOR5, the reset port 80b and the thirtieth node nd30 are connected to the input terminals respectively, and the thirty first node nd31 is connected to the output terminal.

The thirtieth inverter INV30, which is connected between the thirtieth node nd30 and the thirty first node nd31, latches a signal generated at the thirty first node nd31.

The thirty first inverter INV31, where the thirty second node nd32 is connected to the input terminal and the third output port 80e is connected to the output terminal, latches a signal generated at the third output port 80e.

The thirty second inverter INV32, where the third output port 80e is connected to the input terminal and the thirty second node nd32 is connected to the output terminal, latches a signal generated at the third output port 80e.

The above mentioned data multiplexer 82 has a circuit to transfer the data read from the data register 78 to the input/output buffer 42.

Figure 24:
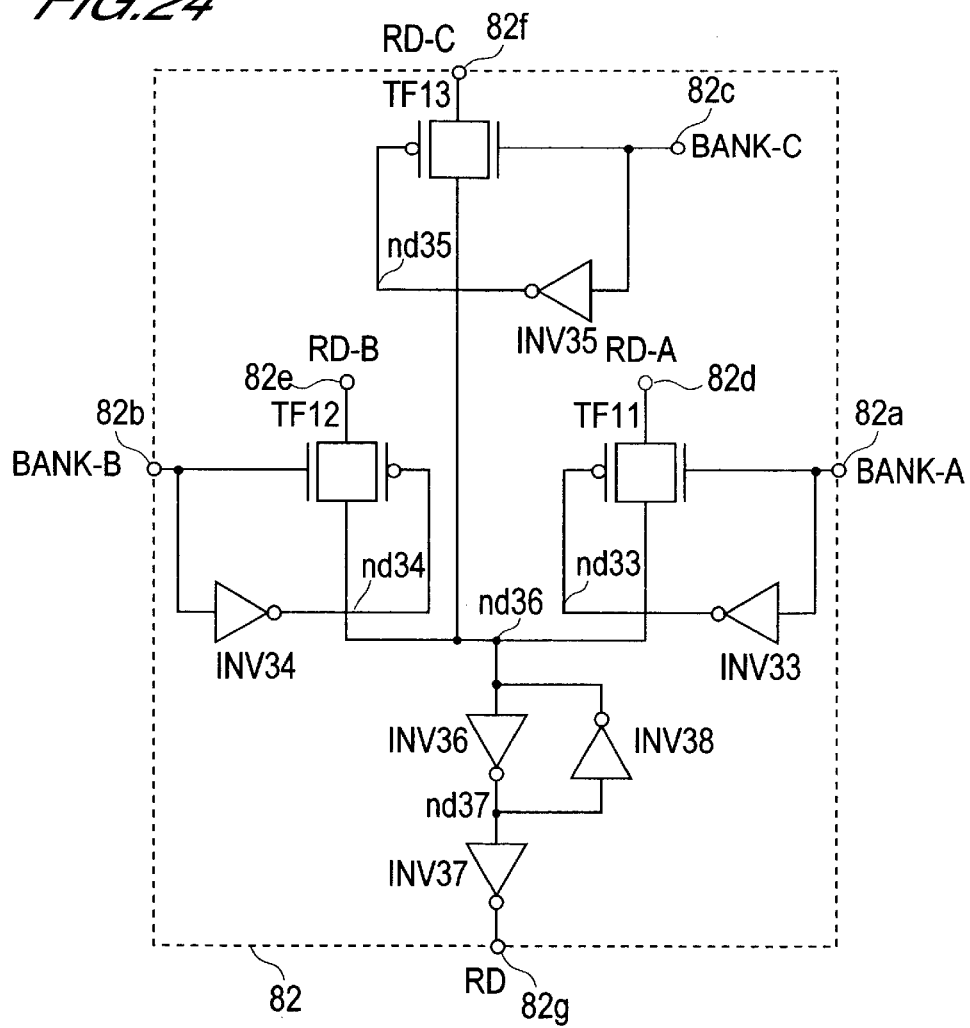
FIG. 24 is a diagram depicting a configuration of a data multiplexer of the sixth embodiment.

FIG. 24 is a circuit diagram depicting a configuration example of the data multiplexer 82. The data multiplexer in FIG. 24 is the data multiplexer 40 in FIG. 5 to which the transfer gate TF13 and the thirty fifth inverter INV35 are added to output the read data signal RD-C as read data RD according to the signal BANK-C. This data multiplexer 82 is a circuit to connect RD-C, RD-A and RD-B to the terminal 82g at the rise of BANK-C, BANK-A and BANK-B.

As FIG. 24 shows, the data multiplexer 82 is comprised of the first, second and third input ports 82a, 82b and 82c where the bank select signals BANK-A, BANK-B and BANK-C are input respectively, the first, second and third read ports 82d, 82e and 82f where the read signals RD-A, RD-B and RD-C from each bank (including the data register) are input respectively, and the fourth read port 82*g*, where one of the read signals input to the first, second and third read port is output as the read data RD.

This data multiplexer 82 is comprised of six inverters and three transfer gates.

In the thirty third inverter INV33, the first input port 82*a* is connected to the input terminal, and the reverse phase signal of the first bank select signal BANK-A is output to the output terminal. This output terminal of the INV33 is connected to one gate of TF11, and this connection point is the thirty third node nd33.

The eleventh transfer gate TF11 is connected to the first read port 82*d* and twelfth and thirteenth transfer gates TF12 and TF13, and the connection point is the thirty sixth node nd36. This TF11 has gate terminals where the first bank select signal BANK-A and the reverse phase signal thereof are input, and turns ON when the first bank select signal BANK-A is activated.

In the thirty fourth inverter INV34, the second input port 82*b* is connected to the input terminal and the output terminal is connected to the gate of TF12. The connection point is the thirty fourth node nd34. This INV34 outputs the reverse phase signal of the second bank select signal BANK-B.

The twelfth transfer gate TF12, which is connected between the second read port 82*e* and the thirty sixth node nd36, has gate terminals where the second bank select signal BANK-B and the reverse phase signal thereof are input, and turns ON when the second bank select signal BANK-B is activated.

In the thirty fifth inverter INV35, the third input port 82*c* is connected to the input terminal, and the output terminal is connected to one gate terminal of TF13. The connection point is the thirty fifth node nd35. This INV34 outputs the reverse phase signal of the third bank select signal BANK-C.

The thirteenth transfer gate TF13, which is connected between the third read port 82*f* and the thirty sixth node nd36, has gates where the third bank select signal BANK-C and the reverse phase signal thereof are input, and turns ON when the third bank select signal BANK-C is activated.

In the thirty sixth inverter INV36, the thirty sixth node nd36 is connected to the input terminal, and the output terminal is connected to the input terminal of the thirty seventh inverter INV37. The connection point is the thirty seventh node nd37.

In the thirty seventh inverter INV37, the thirty seventh node nd37 is connected to the input terminal, and the fourth read port 82*g* is connected to the output terminal.

The thirty eighth inverter INV38, where the thirty seventh node nd37 is connected to the input terminal and the thirty sixth node nd36 is connected to the output terminal, latches a signal generated at the thirty seventh node nd37.

Figure 25:
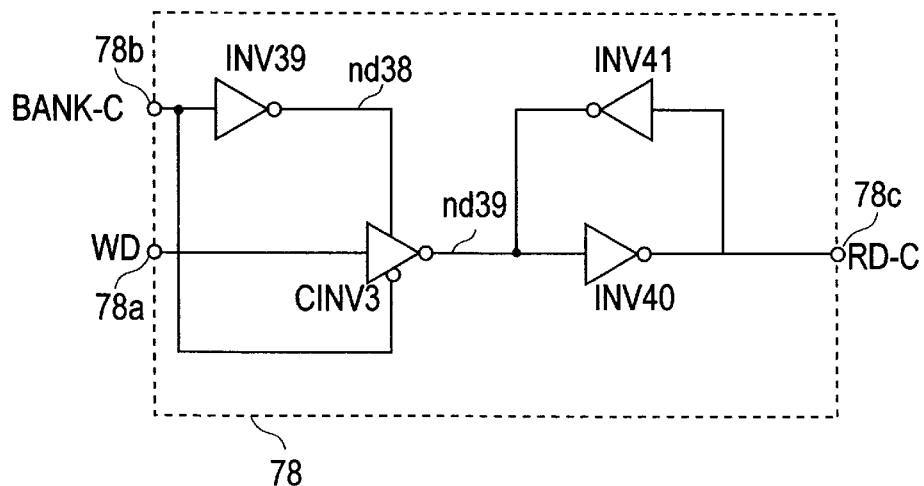
FIG. 25 is a diagram depicting a configuration of a data register constituting the semiconductor storage device of the sixth embodiment.

FIG. 25 is a circuit diagram depicting a configuration example of the data register 78. The data register 78 in FIG. 25 is comprised of three inverters and one clocked inverter. The data register 78 is also comprised of a first input terminal 78*a* where the write data WD is input, a second input terminal 78*b* where BANK-C is input, and an output terminal 78*c* where the read data line RD-C is connected.

As FIG. 25 shows, the thirty ninth inverter INV39, where the input terminal is connected to the second input terminal 78*b*, generates a reverse phase signal of BANK-C. The third clocked inverter CINV3 is connected between the first input terminal 78*a* and the input terminal of the fortieth inverter INV40, receives BANK-C as gate input, and turns ON when the reverse phase signal is activated. The contact point of the output terminal of INV39 and the gate of CINV3 is the thirty eighth node nd38. The fortieth inverter INV40 is connected to the output terminal of CINV3, and the connection point is the thirty ninth node nd39. The output terminal of this INV40 is connected to the output terminal 78*c*. The forty first inverter INV41 is connected between the output terminal 78*c* and the thirty ninth node nd39, and latches a signal generated at the read line RD-C.

The operation of this semiconductor storage device will now be described with reference to the timing chart in FIG. 26. Since operations other than the data register are the same as the case of the first embodiment, description thereof will be omitted.

Figure 26:
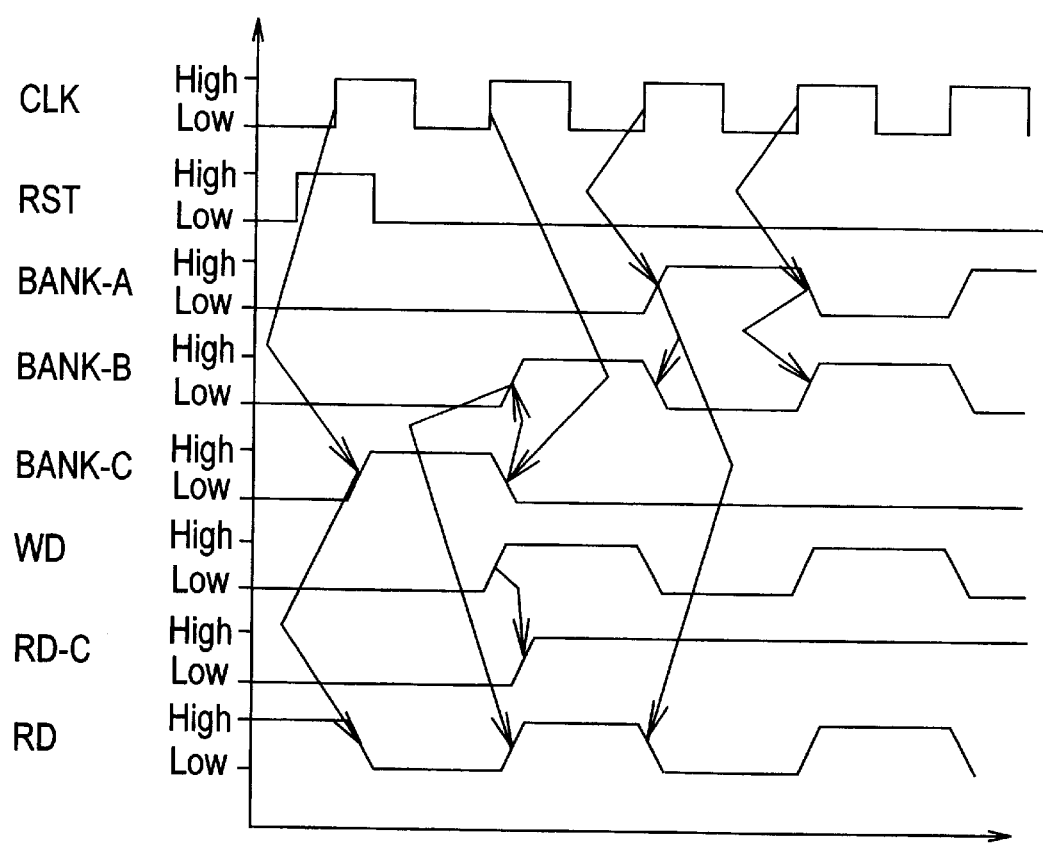
FIG. 26 is an operational diagram of the semiconductor storage device of the sixth embodiment.
Figure 27:
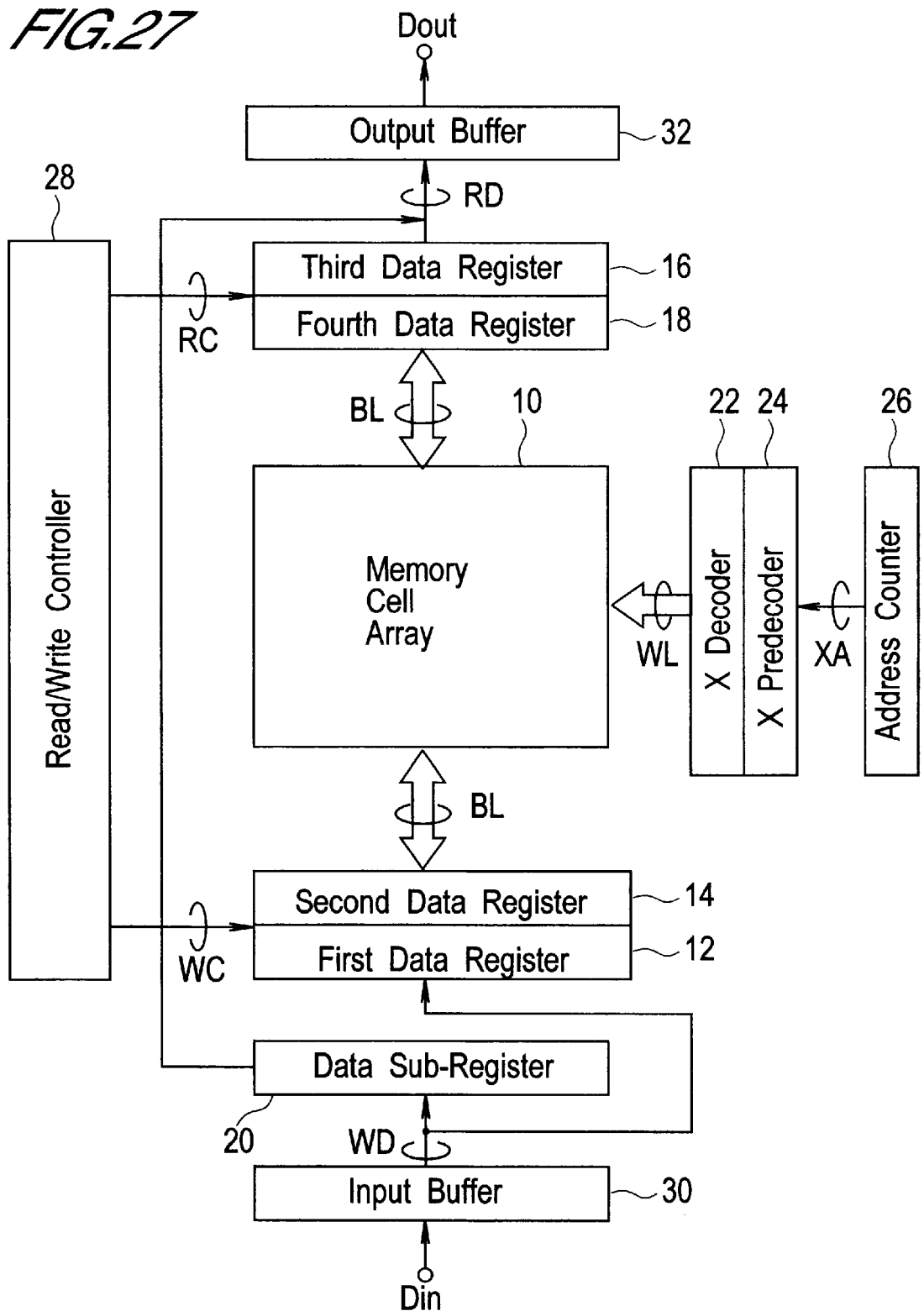
FIG. 27 is a diagram depicting a configuration of a conventional semiconductor storage device.
Figure 28:
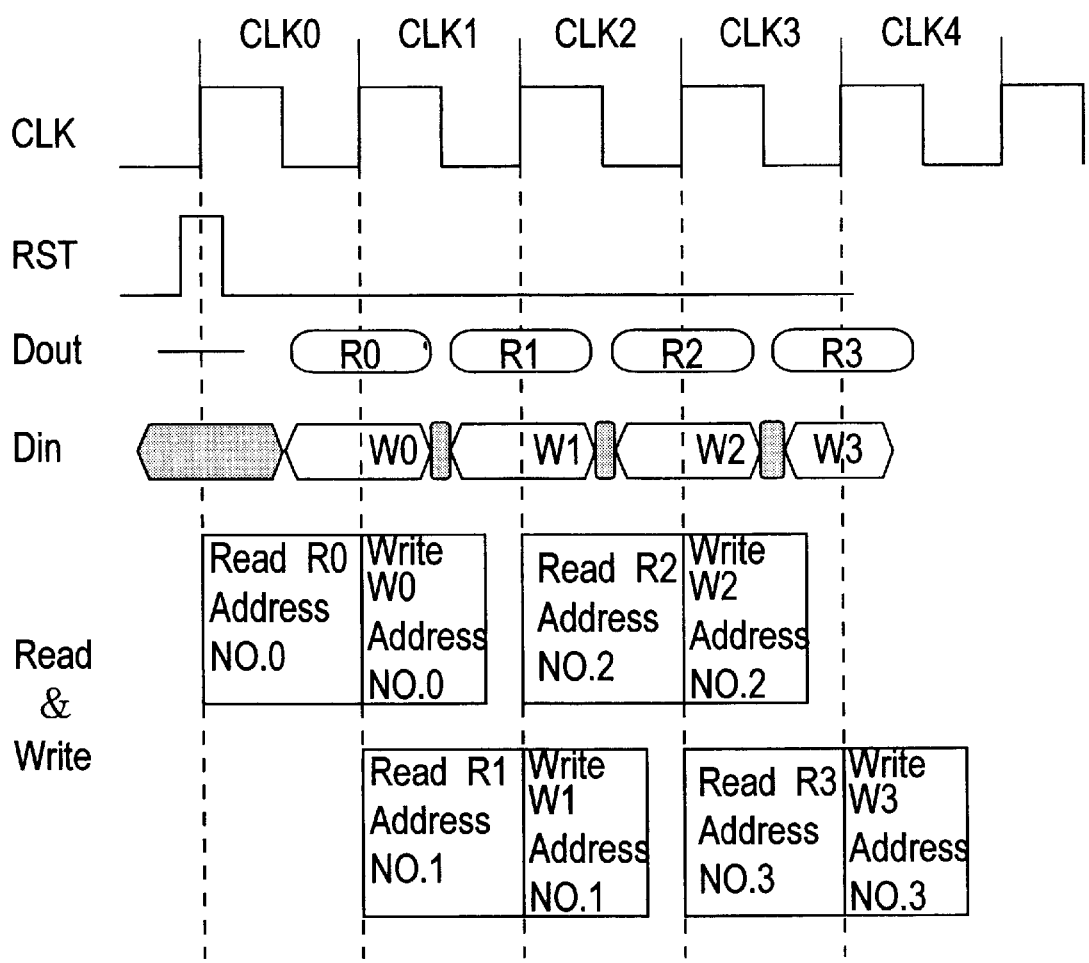
FIG. 28 is an operational diagram depicting the conventional semiconductor storage device.

As FIG. 26 shows, the bank selector 80 accesses the data register 78 only for the first bit during a read operation and a write operation, that is, rises the signal BANK-C. The data multiplexer 82 outputs the data of the read data line RD-C as the read data RD at the rise of the signal BANK-C. The data register 78 also outputs the write data WD to the read data line RD-C at the fall of the signal BANK-C, and latches this until the next fall of the signal BANK-C. After the fall of the signal BANK-C, the operation described for the first embodiment starts in bank A and bank B.

In this way, a line memory operation similar to the first embodiment can be implemented. Also a reset is possible regardless which bank is being accessed.

In the above described embodiments, an SRAM cell was assumed to be used for the memory cell, but the configuration of the semiconductor storage devices of the above embodiments can be applied to the case when the memory cell is a DRAM cell.

According to the semiconductor storage device of the present invention, a data read operation and a data write operation are executed synchronizing with the cycle unit of the clock signal, and two memory cell arrays are used, where at one cycle after a read operation from a memory cell at a predetermined address of one memory cell array, a write operation is executed to the memory cell at the same address of this memory cell array, and a read operation is also executed to a memory cell at a predetermined address of the other memory cell array. According to this configuration, a line memory operation is possible without using a data register and data sub-register, by which chip size can be decreased.

What is claimed is:

1. A semiconductor storage device which performs read and write operations of data synchronizing with the cycle unit of a clock signal, comprising two memory cell arrays, wherein at one cycle after a read operation from a memory cell at a predetermined address of one of said memory cell arrays, a write operation is performed to the memory cell at the same address of said memory cell array, and a read operation is also performed to a memory cell at a predetermined address of said other memory cell array, and wherein the memory cell to be read out in said one of the memory cell arrays is selected by address information generated relating to a bank select signal, and the memory cell to be written to in said other memory cell array is selected by said address information.

2. A semiconductor storage device which performs read and write operations of data synchronizing with the cycle unit of a clock signal, comprising two memory cell arrays, wherein at one cycle after a read operation from a memory cell at a predetermined address of one of said memory cell arrays, a write operation is performed to the memory cell at the same address of said memory cell array, and a read operation is also performed to a memory cell at a predetermined address of said other memory cell array, and an array select circuit, a cell select circuit, a data transfer circuit and an input/output buffer, wherein said array select circuit generates an array select signal for selecting said memory cell arrays alternately, said cell select circuit selects a predetermined memory cell of said memory cell array selected by said array select signal and performs a read operation from and a write operation to this memory cell, and said data transfer circuit transfers the read data from said memory cell array selected by said array select signal to said input/output buffer.

3. A semiconductor storage device according to claim 2, further comprising an input/output data amplifier for amplifying the write data which is sent from said input/output buffer to said memory cell array, and the read data which is sent from said memory cell array to said data transfer circuit.

4. A semiconductor storage device according to claim 2, wherein said cell select circuit comprises an address generation circuit, a row decoder and a column decoder, said address generation circuit generates a row address signal and a column address signal for said memory cell array selected by said array select signal, and said row decoder selects a predetermined word line according to said row address signal, and said column decoder selects a predetermined bit line according to said column address signal so as to select a predetermined memory cell of said predetermined memory cell array.

5. A semiconductor storage device according to claim 4, wherein said cell select circuit further comprises an address counter as said address generation circuit, said row decoder, and said column decoder for each one of said memory cell arrays, said row decoder is comprised of a row predecoder and a row main decoder, said column decoder is comprised of a column predecoder and a column main decoder, when said row predecoder generates a row predecoding signal according to the row address signal from said address counter, said row main decoder selects a predetermined word line according to this row predecoding signal, and when said column predecoder generates a column predecoding signal according to the column address signal from said address counter, said column main decoder selects a predetermined bit line according to this column predecoding signal.

6. A semiconductor storage device according to claim 4, wherein said cell select circuit comprises one address counter as said address generation circuit, and also comprises a row decoder and column decoder for each one of said memory cell arrays, said row decoder is comprised of a row predecoder and a row main decoder, said column decoder is comprised of a column predecoder and a column main decoder, when said row predecoder generates a row predecoding signal according to the row address signal from said address counter, said row main decoder selects a predetermined word line according to this row predecoding signal, when said column predecoder generates a column predecoding signal according to the column address signal from said address counter, said column main decoder selects a predetermined bit line according to this column predecoding signal, and said row predecoder and said column predecoder have a latching function for holding said row predecoding signal and said column predecoding signal for a predetermined period respectively.

7. A semiconductor storage device according to claim 4, wherein said row decoder is comprised of a row predecoder and a row main decoder, said column decoder is comprised of a column predecoder and a column main decoder, said cell select circuit comprises an address counter as said address generation circuit, said row predecoder and said column predecoder, one each, and also comprises said row main decoder and the column main decoder for each one of said memory cell arrays, when said row predecoder generates a row predecoding signal according to the row address signal from said address counter, said row main decoder selects a predetermined word line according to this row predecoding signal, said row main decoder has a latching function to hold the selection of said word line for a predetermined period, when said column predecoder generates a column predecoding signal according to the column address signal from said address counter, said column main decoder selects a predetermined bit line according to this column predecoding signal, and said column main decoder has a latching function to hold the selection of said bit line for a predetermined period.

8. A semiconductor storage device according to claim 2, wherein said cell select circuit further comprises a row pointer for sequentially selecting a predetermined word line according to said array select signal, and a column pointer for sequentially selecting a predetermined bit line according to said array select signal.

9. A semiconductor storage device which performs read and write operations of data synchronizing with the cycle unit of a clock signal, comprising two memory cell arrays, wherein at one cycle after a read operation from a memory cell at a predetermined address of one of said memory cell arrays, a write operation is performed to the memory cell at the same address of said memory cell array, and a read operation is also performed to a memory cell at a predetermined address of said other memory cell array, and an array select circuit, a cell select circuit, a data transfer circuit, an input/output buffer and an input/output data amplifier, wherein said array select circuit generates an array select signal for alternately selecting said memory cell arrays, said cell select circuit selects a predetermined memory cell of said memory cell array selected by said array select signal, and performs a read operation from and a write operation to this memory cell, said data transfer circuit performs processing for transferring the read data from said memory cell array selected by said array select signal to said input/output data amplifier, and processing for transferring the write data sent from said input/output data amplifier to said predetermined memory cell array, and said input/output data amplifier amplifies the write data which is sent from said input/output buffer to said data transfer circuit, and the read data which is sent from said data transfer circuit to said input/output buffer.

10. A semiconductor storage device according to claim 2, further comprising a data register for a first bit, wherein said data transfer circuit further comprises a circuit for transferring data read from said data register to said input/output buffer, said array select circuit further comprises a circuit for selecting said data register in addition to selecting said memory cell array, and said data register is accessed only for the first bit at a read operation and a write operation.

11. A semiconductor storage device according to claim 2, wherein said array select signal is comprised of a first and second array select signals which alternately rise, said array select circuit is comprised of a clock port where a clock signal is input, a reset port where a reset signal is input, and a first and second output ports where said first and second array select signals are output respectively, and said array select circuit is further comprised of:

a first inverter where said clock port is connected at the input side and which outputs the reverse phase signal of the clock signal to a first node at the output side;

a first transfer gate, which is connected between a second node and a third node, has gate terminals where the clock signal and the reverse phase signal thereof are input, and turns ON when this reverse signal is activated;

a second transfer gate, which is connected between a fourth node and a fifth node, has gate terminals where the clock signal and the reverse phase signal thereof are input, and turns ON when this clock signal is activated;

a NOR circuit where said reset port and said third node are connected at the input side respectively and said fourth node is connected to the output side;

a second inverter where said first output port is connected at the input side and said second node is connected at the output side;

a third inverter for latching said fourth node, a fourth inverter where said fourth node is connected at the input side and said first output port is connected at the output side;

a fifth inverter for latching said first output port; and a sixth inverter where said first output port is connected at the input side and said second output port is connected at the output side.

12. A semiconductor storage device according to claim 2, wherein said array select signal is comprised of a first and second array select signals which alternately rise, said data transfer circuit is comprised of a first and second input ports where said first and second array select signals are input respectively, a first and second read ports where read signals from each one of said memory cell arrays are input respectively, and a third read port which alternately outputs the read signals input to said first and second read ports, and said data transfer circuit is further comprised of:

a first inverter where said first input port is connected at the input side and which outputs the reverse phase signal of said first block select signal to the first node at the output side;

a first transfer gate, which is connected between the first read port and the third node, has gate terminals where said first block select signal and the reverse phase signal thereof are input, and turns ON when said first block select signal is activated;

a second inverter where said second input port is connected at the input side and which outputs the reverse phase signal of said second block select signal to the second node at the output side;

a second transfer gate, which is connected between said second read port and said third node, has gate terminals where said second block signal and the reverse phase signal thereof are input, and turns ON when said second block select signal is activated;

a third inverter where said third node is connected at the input side and the fourth node is connected at the output side;

a fourth inverter where said fourth node is connected at the input side and said third read port is connected at the output side; and a fifth inverter for latching said fourth node.

* * * * *

UNITED STATES PATENT AND TRADEMARK OFFICE
CERTIFICATE OF CORRECTION

PATENT NO. : 6,333,894 B1
DATED : December 25, 2001
INVENTOR(S) : Akira Nakayami et al.

It is certified that error appears in the above-identified patent and that said Letters Patent is hereby corrected as shown below:

<u>Title page</u>,
Under Foreign Application Priority Data, please delete "12-127083" and replace with -- 2000-127083 --.

Signed and Sealed this

Fourth Day of June, 2002

*Attest:*

*Attesting Officer*

JAMES E. ROGAN
*Director of the United States Patent and Trademark Office*